(12) United States Patent
Khaderbad et al.

(10) Patent No.: US 11,476,333 B2
(45) Date of Patent: Oct. 18, 2022

(54) DUAL CHANNEL STRUCTURE

(71) Applicant: Taiwan Semiconductor Manufacturing Co., Ltd., Hsin-Chu (TW)

(72) Inventors: Mrunal Abhijith Khaderbad, Hsinchu (TW); Dhanyakumar Mahaveer Sathaiya, Hsinchu (TW); Keng-Chu Lin, Hsinchu (TW); Tzer-Min Shen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/937,277

(22) Filed: Jul. 23, 2020

(65) Prior Publication Data
US 2021/0305372 A1   Sep. 30, 2021

Related U.S. Application Data

(60) Provisional application No. 63/002,505, filed on Mar. 31, 2020.

(51) Int. Cl.
*H01L 29/10* (2006.01)
*H01L 29/78* (2006.01)
(Continued)

(52) U.S. Cl.
CPC .. *H01L 29/1037* (2013.01); *H01L 21/823807* (2013.01); *H01L 21/823821* (2013.01);
(Continued)

(58) Field of Classification Search
CPC ............ H01L 29/1037; H01L 29/0649; H01L 29/66795; H01L 29/785; H01L 29/42392; H01L 29/78696; H01L 29/1606; H01L 29/778; H01L 21/823807; H01L 21/823821; H01L 21/823878;
(Continued)

(56) References Cited

U.S. PATENT DOCUMENTS 9,768,313 B2   9/2017   Yeh et al.
10,388,732 B1   8/2019   Frougier et al.
(Continued)

FOREIGN PATENT DOCUMENTS

KR   20150058521 A   5/2015
WO   2014099003 A1   6/2014

OTHER PUBLICATIONS

Cheng Gong, et al., Band alignment of two-dimensional transition metal dichalcogenides: Application in tunnel field effect transistors, Appl. Phy. Lett. 103, 053513 (2013): https://doi.org/10.1063/1.4817409.

*Primary Examiner* — Dao H Nguyen
(74) *Attorney, Agent, or Firm* — Haynes and Boone, LLP

(57) ABSTRACT

Semiconductor devices and methods of forming the same are provided. A semiconductor device according to the present disclosure includes a channel member including a first channel layer and a second channel layer over the first channel layer, and a gate structure over the channel member. The first channel layer includes silicon, germanium, a III-V semiconductor, or a II-VI semiconductor and the second channel layer includes a two-dimensional material.

20 Claims, 20 Drawing Sheets

(51) Int. Cl.
  *H01L 29/66* (2006.01)
  *H01L 21/8238* (2006.01)
  *H01L 27/092* (2006.01)
  *H01L 29/06* (2006.01)

(52) U.S. Cl.
  CPC .. *H01L 21/823878* (2013.01); *H01L 27/0924* (2013.01); *H01L 29/0649* (2013.01); *H01L 29/66795* (2013.01); *H01L 29/785* (2013.01)

(58) Field of Classification Search
  CPC ......... H01L 21/8258; H01L 21/823412; H01L 27/0924; H01L 27/088; H01L 27/092
  USPC ....................................................... 257/288
  See application file for complete search history.

(56) References Cited

U.S. PATENT DOCUMENTS

| | | | |
|---|---|---|---|
| 10,411,135 B2* | 9/2019 | Moroz | H01L 29/778 |
| 2015/0364592 A1* | 12/2015 | van Dal | H01L 29/66795 257/29 |
| 2020/0075593 A1* | 3/2020 | Xiao | H01L 29/66431 |
| 2020/0098865 A1 | 3/2020 | Lu et al. | |
| 2021/0066292 A1* | 3/2021 | Xiao | H01L 21/02532 |
| 2021/0135015 A1* | 5/2021 | Frougier | H01L 29/1037 |

\* cited by examiner

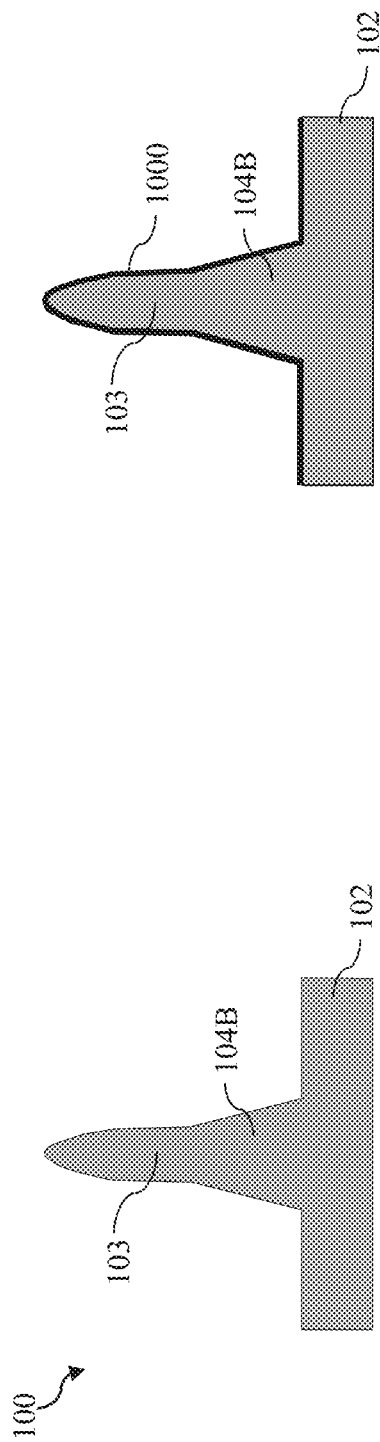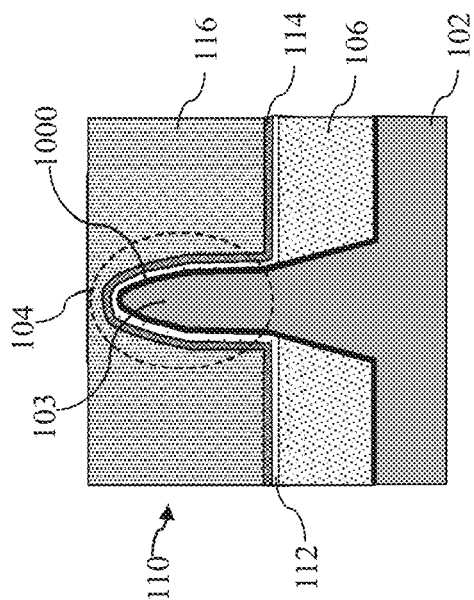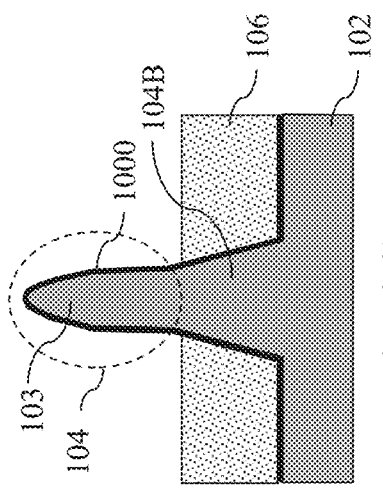

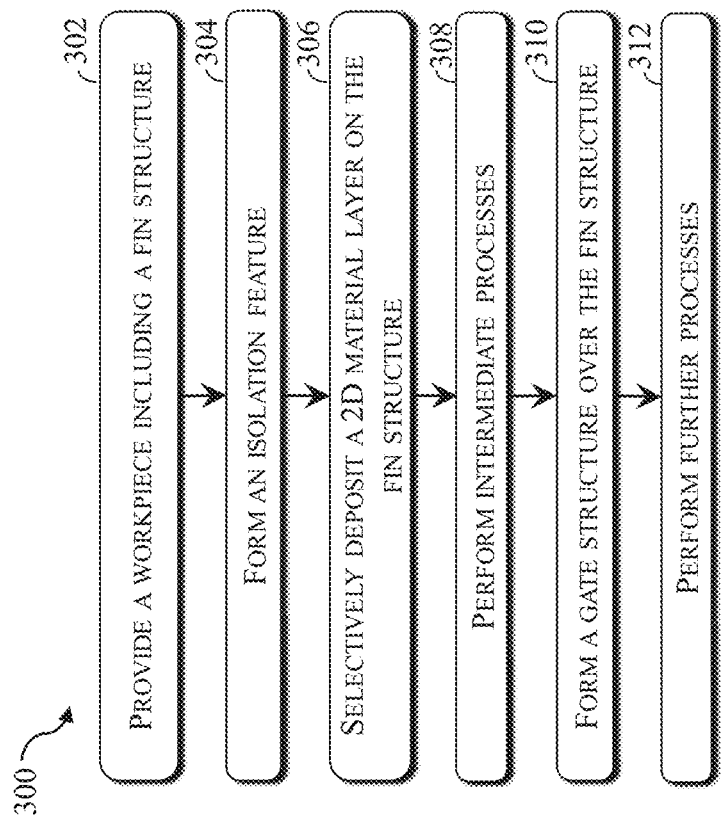

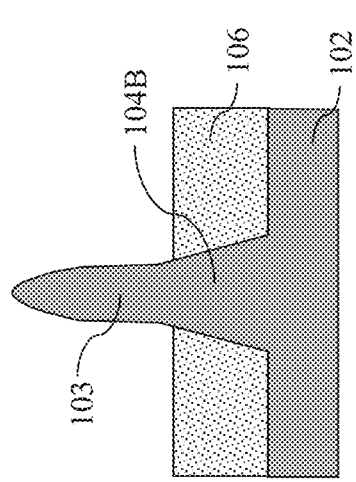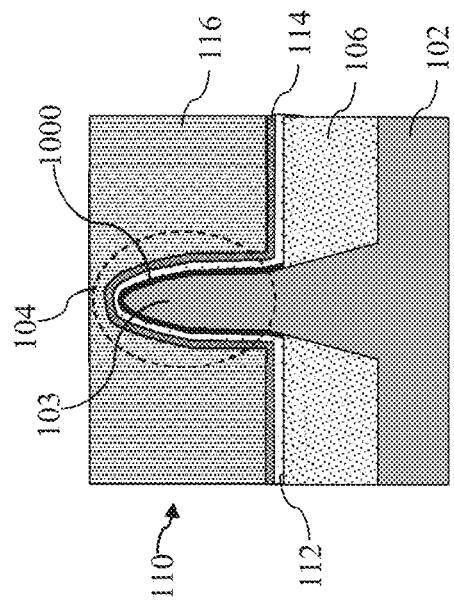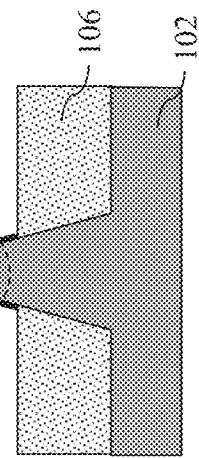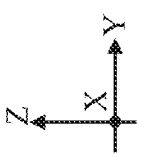

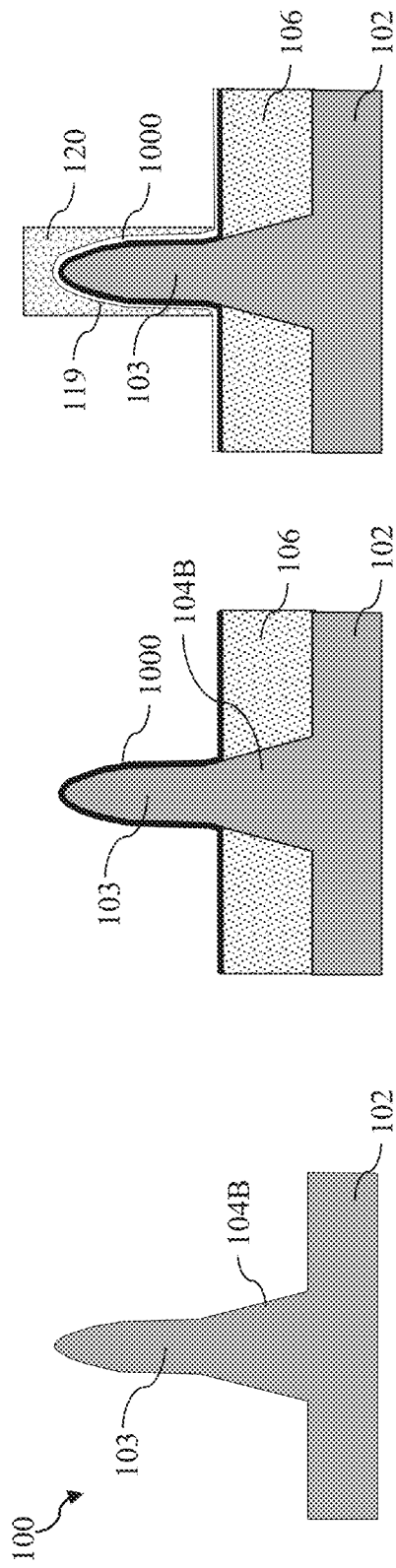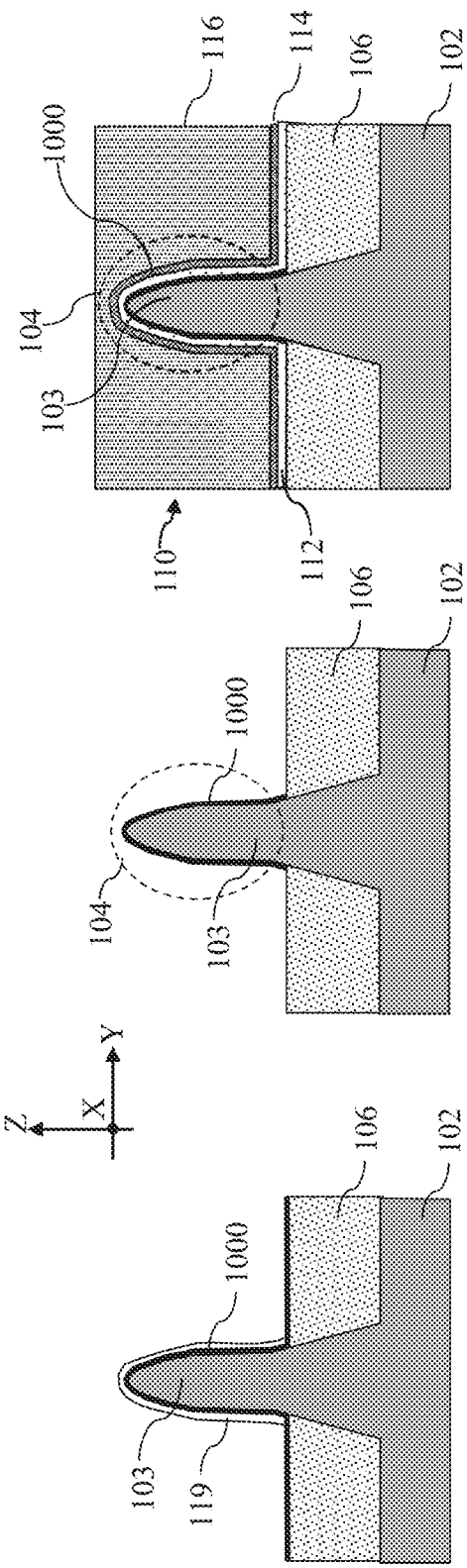

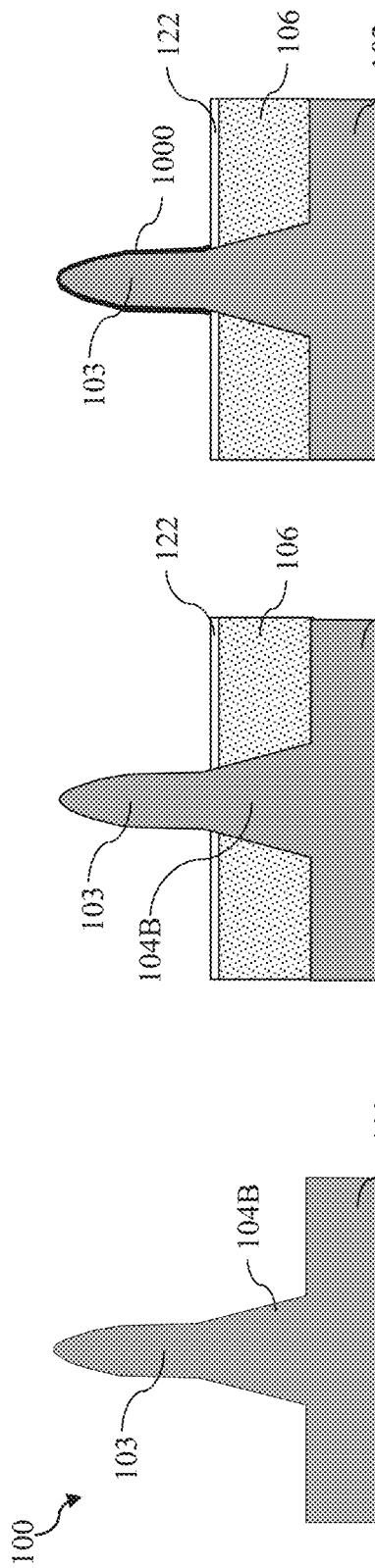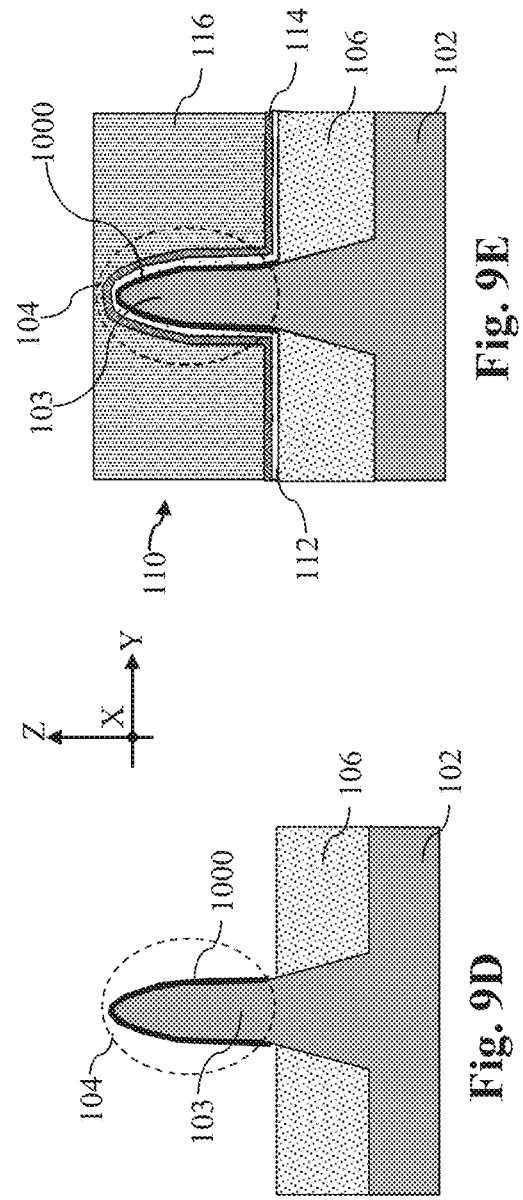

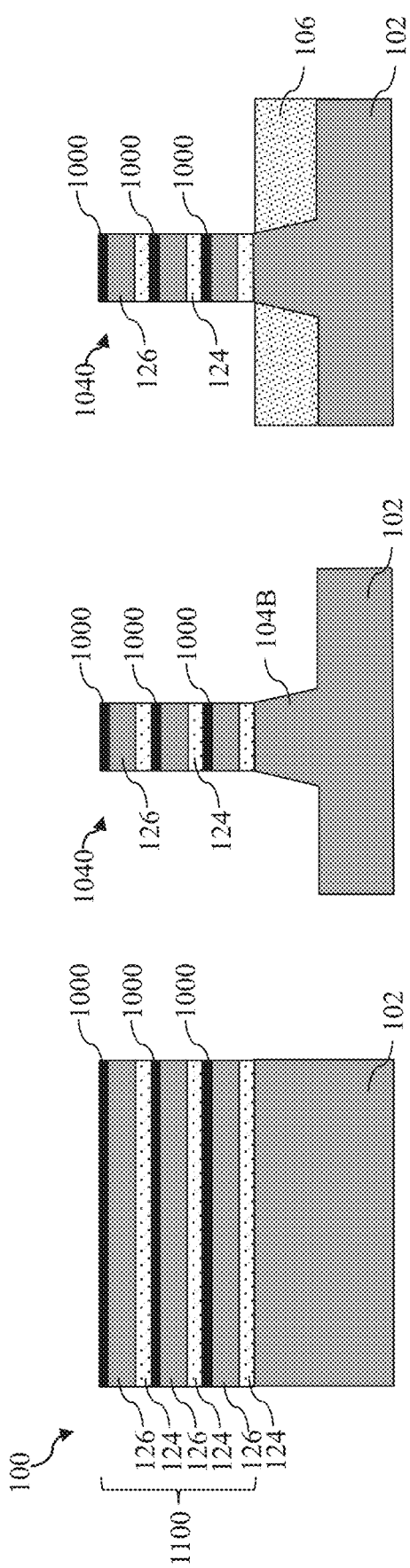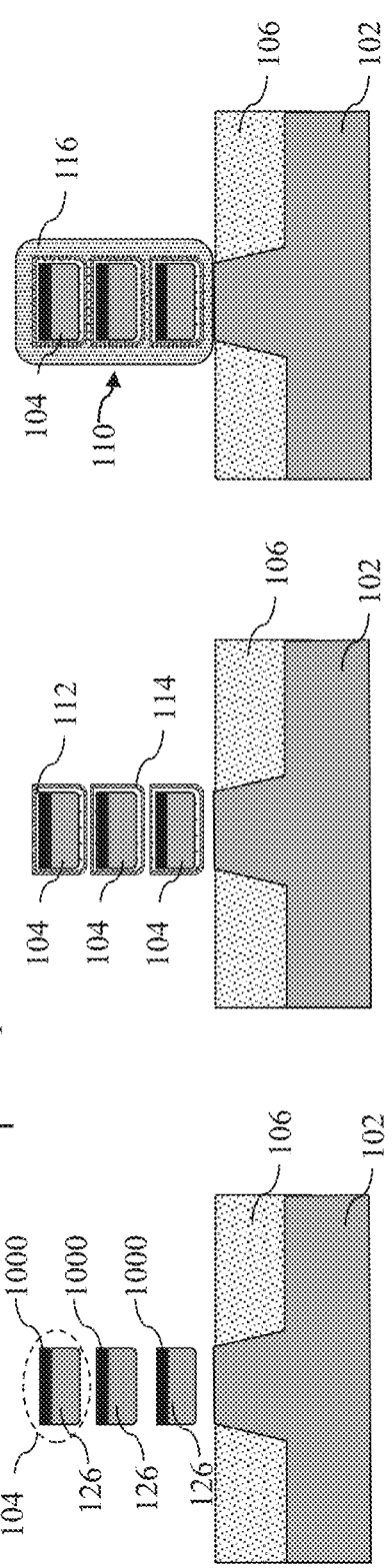

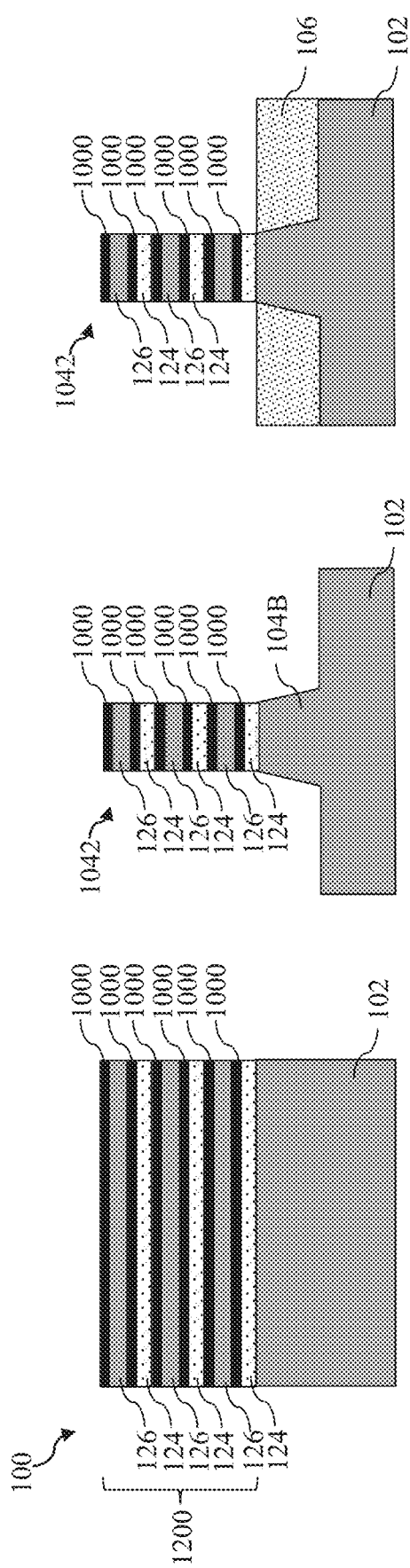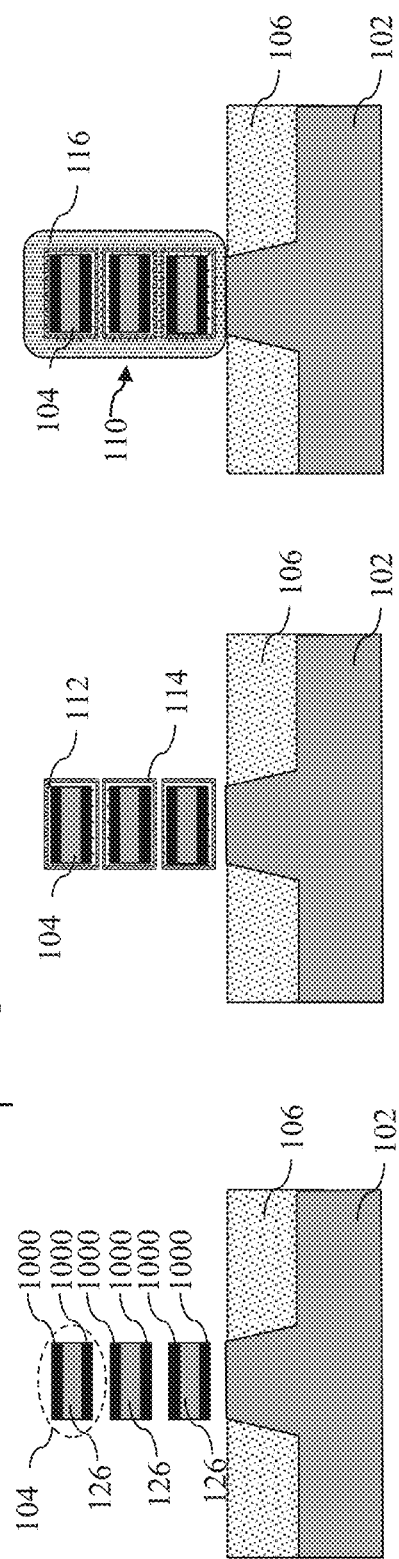

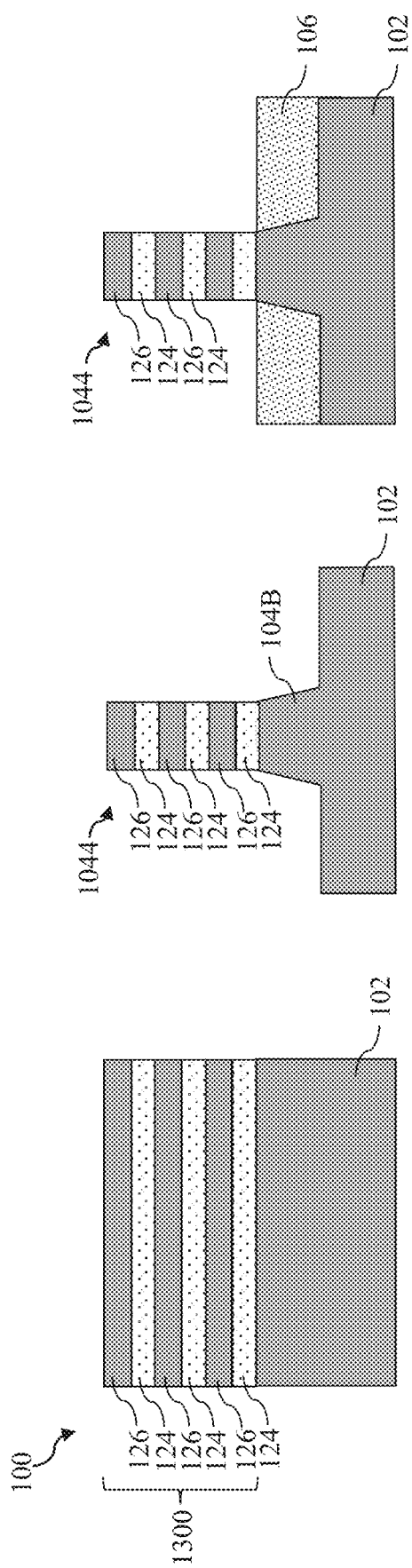
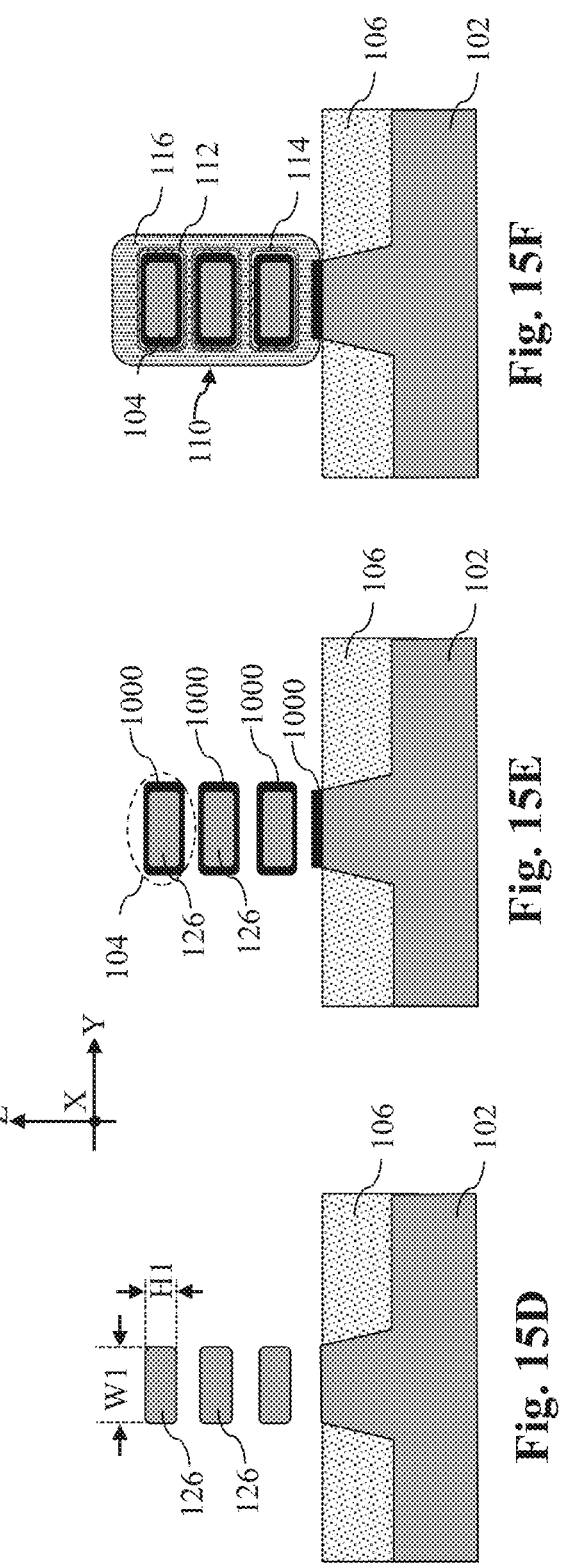
Fig. 15A  Fig. 15B  Fig. 15C
Fig. 15D  Fig. 15E  Fig. 15F

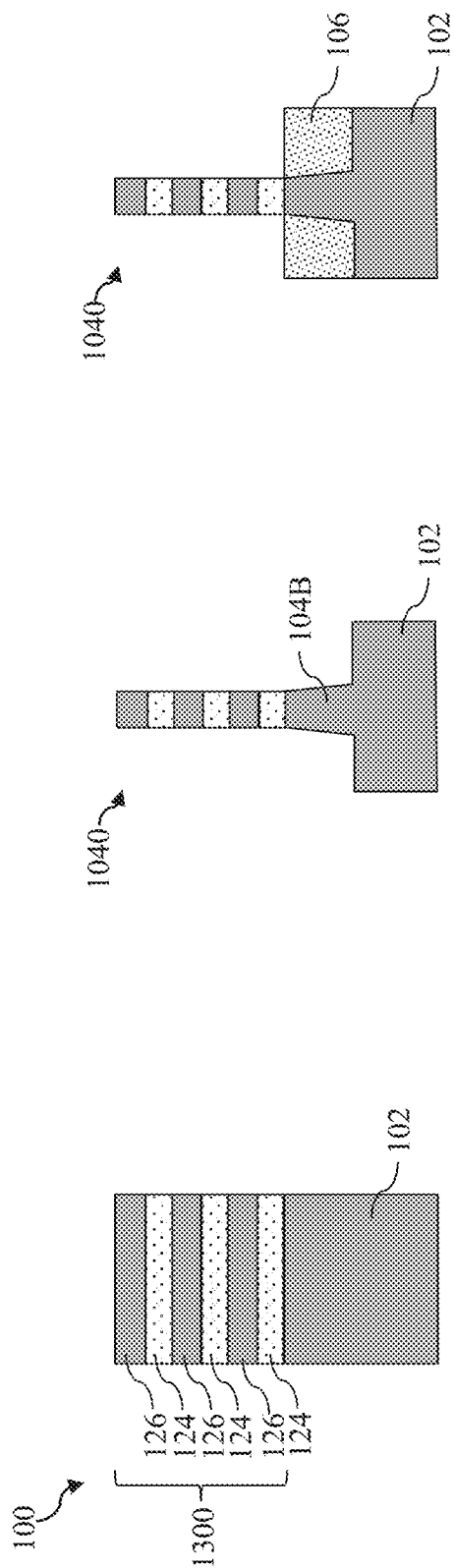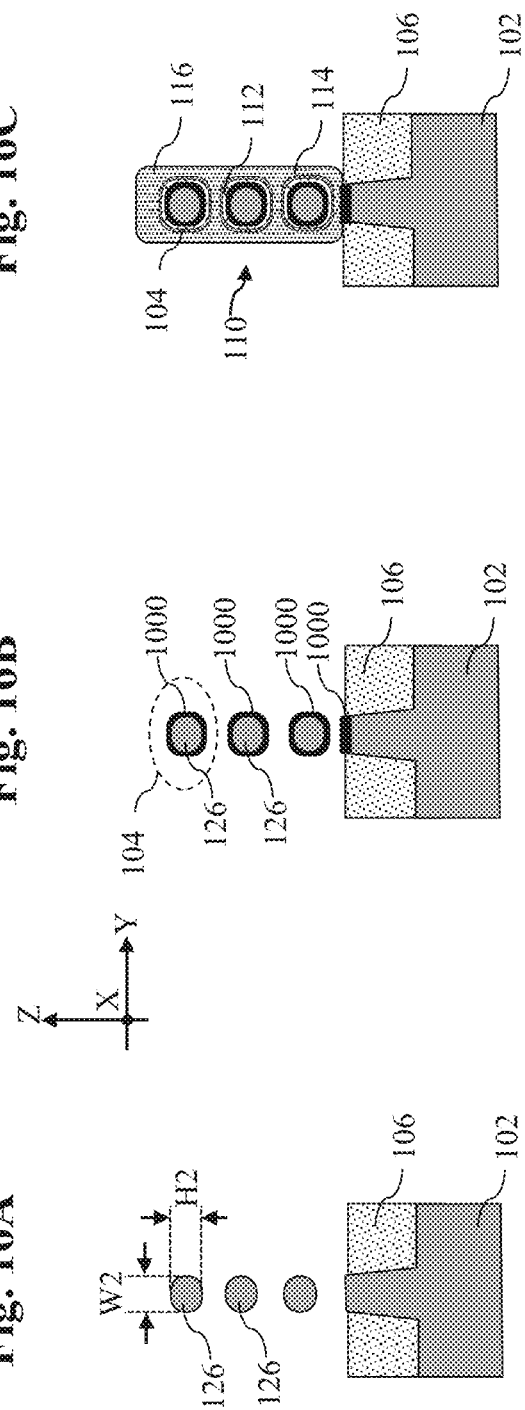

DUAL CHANNEL STRUCTURE

PRIORITY DATA

This application claims priority to U.S. Provisional Patent Application No. 63/002,505 filed on Mar. 31, 2020, entitled "DUAL CHANNEL STRUCTURE", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. As the scaling down continues, MBC transistors may not provide satisfactory drive current. Therefore, while conventional multi-gate structures may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3D illustrate fragmentary cross-sectional views of a workpiece at various fabrication stages of the first method in FIG. 2, according to one or more aspects of the present disclosure.

FIG. 4 illustrates a flowchart of a second method of fabricating a semiconductor device, according to one or more aspects of the present disclosure.

FIGS. 5A-5D illustrate fragmentary cross-sectional views of a workpiece at various fabrication stages of the second method in FIG. 4, according to one or more aspects of the present disclosure.

FIGS. 7A-7F illustrate fragmentary cross-sectional views of a workpiece at various fabrication stages of the third method in FIG. 6, according to one or more aspects of the present disclosure.

FIGS. 9A-9E illustrate fragmentary cross-sectional views of a workpiece at various fabrication stages of the fourth method in FIG. 8, according to one or more aspects of the present disclosure.

FIGS. 11A-11F illustrate fragmentary cross-sectional views of a workpiece at various fabrication stages of the fifth method in FIG. 10, according to one or more aspects of the present disclosure.

FIGS. 13A-13F illustrate fragmentary cross-sectional views of a workpiece at various fabrication stages of the sixth method in FIG. 12, according to one or more aspects of the present disclosure.

FIGS. 15A-15F and 16A-16F illustrate fragmentary cross-sectional views of a workpiece at various fabrication stages of the seventh method in FIG. 14, according to one or more aspects of the present disclosure.

DETAILED DESCRIPTION

Figure 1:
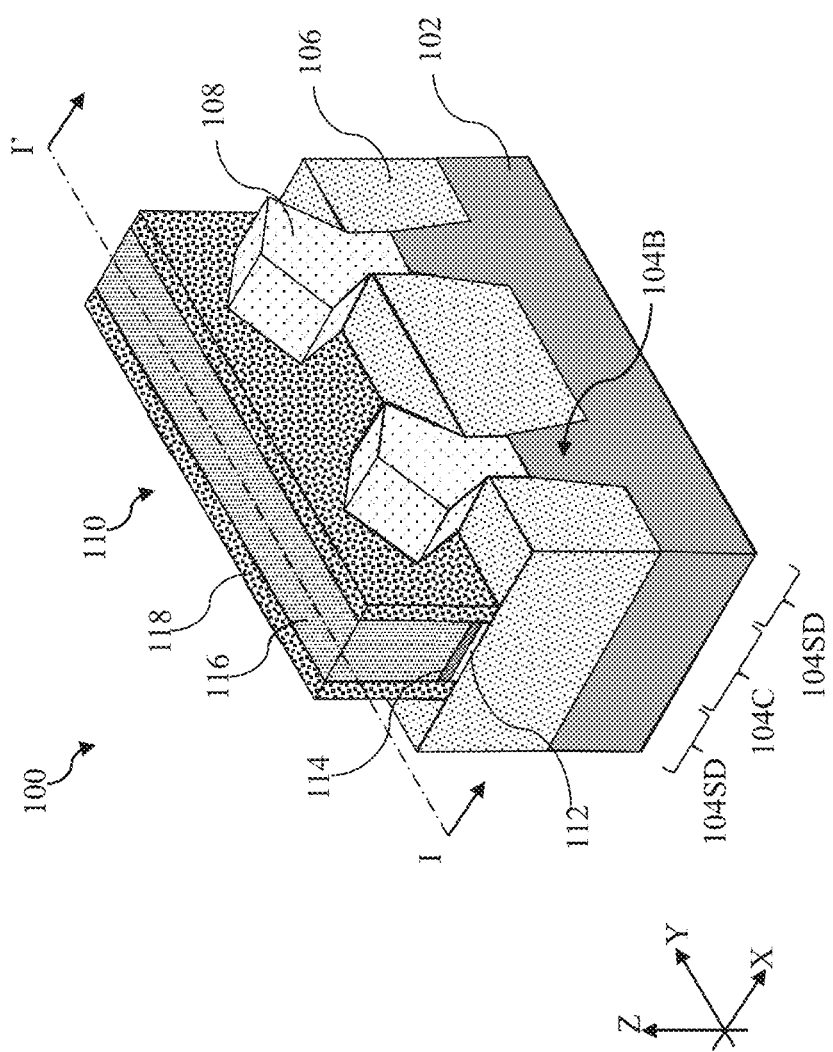
FIG. 1 illustrates a perspective view of a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to multi-gate transistors having a channel member that includes a second channel layer formed of a two-dimensional material in addition to a first channel layer.

Multi-gate devices include transistors whose gate structures are formed on at least two-sides of a channel region. Examples of multi-gate devices include fin-like field effect transistors (FinFETs) having fin-like structures and MBC transistors having a plurality of a channel members. As described above, MBC transistors may also be referred to as SGTs, GAA transistors, nanosheet transistors, or nanowire transistors. These multi-gate devices may be either n-type or p-type. An MBC transistor includes any device that has its gate structure, or portion thereof, formed on 4-sides of a channel region (e.g., surrounding a portion of a channel region). MBC devices according to the present disclosure may have channel regions disposed in nanowire channel members, bar-shaped channel members, nanosheet channel members, nanostructure channel members, bridge-shaped channel members, and/or other suitable channel configurations. As the scaling down continues, the dimensions of channel members in n MBC transistor may not support a satisfactory level of drive current.

The present disclosure provides embodiments of a semiconductor device whose channel member includes a first channel layer formed of silicon, germanium, a III-V semiconductor, or a II-VI semiconductor and a second channel layer formed of a two-dimensional (2D) material. The second channel layer is configured to have a band gap similar to that of the first channel layer. As such, the first channel layer and the second channel layer may be turned on at the same time. The second channel layer functions as a drive current booster to increase the overall drive current of the semiconductor device. Due to the implementation of the first channel layer and the second channel layer, semiconductor devices of the present disclosure may be referred to as dual-channel transistors (DCTs), dual-channel field effect transistors (DCFETs), or dual-modality field effect transistor (DMFETs). A DCFET may be a planar device, a FinFET, or an MBC transistor. Embodiments in FinFETs and MBC transistors are illustrated and described herein.

The various aspects of the present disclosure will now be described in more detail with reference to the slides. FIG. 1 illustrates a perspective view of a semiconductor device 100, which may be a FinFET or an MBC transistor. As the semiconductor device 100 is formed from a workpiece, it may be referred to as a workpiece 100 as the context requires. As shown in FIG. 1, the semiconductor device 100 includes a substrate 102. In one embodiment, the substrate 102 may be a silicon substrate. In some other embodiments, the substrate 102 may include other semiconductors such as germanium (Ge), silicon germanium (SiGe), a III-V semiconductor material, or a II-VI semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). Example II-VI semiconductor materials may include cadmium selenide (CdSe), cadmium sulfide (CdS), cadmium telluride (CdTe), zinc selenide (ZnSe), zinc sulfide (ZnS), and zinc telluride (ZnTe).

The semiconductor device 100 in FIG. 1 includes one or more channel members (104, not shown in FIG. 1, but are shown in FIGS. 3D, 5D, 7F, 9E, 11F, 13F, 15F, and 16F) that are disposed over base portions 104B extending from the substrate 102. It is noted that only base portions 104B are illustrated in FIG. 1. The channel members are not visible in FIG. 1 due to presence of other structures. The one or more channel members and base portions 104B extends lengthwise along the X direction. The semiconductor device 100 also includes an isolation feature 106 that isolate neighboring base portions 104B. Each of base portions 104B includes a channel region 104C sandwiched between two source/drain regions 104SD. The channel members are disposed over the channel region 104C and source/drain features 108 are disposed over the source/drain regions 104SD. A gate structure 110 that extends along the Y direction (which is perpendicular to the X direction) is disposed the channel members over the channel regions 104C. The gate structure 110 may include an interfacial layer 112, a gate dielectric layer 114 over the interfacial layer 112, and a gate electrode 116 over the gate dielectric layer 114. In some embodiments, the gate structure 110 may be spaced apart from the source/drain features 108 by a gate spacer layer 118.

The isolation feature 106 may also be referred to as a shallow trench isolation (STI) feature 106. The isolation feature 106 may include silicon oxide, silicon nitride, silicon oxynitride, fluorine-doped silicate glass (FSG), a low-k dielectric, combinations thereof, and/or other suitable materials. The source/drain features 108 may include a semiconductor material doped with an n-type dopant, such as phosphorus (P) or arsenide (As), or a p-type dopant, such as boron (B). The semiconductor material for the source/drain features 108 may include silicon or silicon germanium. In one embodiment when the semiconductor device 100 is n-type, the source/drain features 108 may include silicon and may be doped with phosphorus (P). In another embodiment when the semiconductor device 100 is p-type, the source/drain features 108 may include silicon germanium doped with boron (B).

The interfacial layer 112 of the gate structure 110 may include a dielectric material such as silicon oxide, hafnium silicate, or silicon oxynitride. In some embodiments, in order to better interface the 2D materials, the interfacial layer 112 may include hexagonal boron nitride. The gate dielectric layer 114 of the gate structure 110 may include a high-k dielectric material that has a dielectric material with a dielectric constant greater than that of silicon dioxide, which is about 3.9. In some instances, the gate dielectric layer 114 may include hafnium oxide, zirconium oxide, zirconium aluminum oxide, hafnium aluminum oxide, hafnium silicon oxide, aluminum oxide, titanium oxide, tantalum oxide, lanthanum oxide, yttrium oxide, tantalum carbonitride, zirconium nitride, combinations thereof, or other suitable material. In some instances, the gate dielectric layer 114 may have a thickness between about 5 nm and about 30 nm. The gate electrode 116 of the gate structure 110 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode 116 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. The gate spacer layer 118 may be a single layer or a multi-layer. In some instances, the gate spacer layer 118 may include silicon oxide, silicon oxycarbide, silicon carbonitride, silicon nitride, zirconium oxide, aluminum oxide, a suitable low-k dielectric material, or a suitable dielectric material.

Depending on whether the semiconductor device 100 is a FinFET or an MBC transistor, the channel members may be formed from the substrate 102 alone or from a stack of epitaxial layers on the substrate 102. When the semiconductor device 100 is a FinFET, the channel member 104 may resemble a fin, as representatively shown in FIGS. 3D, 5D, 7F, and 9E. When the semiconductor device 100 is an MBC transistor, the channel member 104 may resemble a sheet or a wire, as representatively shown in FIGS. 11F, 13F, 15F, and 16F. Referring back to FIG. 1, regardless of the shape of the channel member 104, the channel member 104 (shown in FIGS. 3D, 5D, 7F, 9E, 11F, 13F, 15F, and 16F) extend between two source/drain features 108 on opposing sides of the gate structure 110.

According to the present disclosure, a channel member 104 of the semiconductor device 100 includes one or more layers formed of a two-dimensional (2D) material. Here, a 2D material refers to a semiconductor material that is thin (i.e., having a thickness between about 1 Å and about 30 Å) and is conductive only along a two-dimensional plane. A 2D material is conductive only along a two-dimensional plane because charge carriers, such as electrons, are only free to move along the two-dimensional plane. In some instances, a 2D material may also be referred to as a single-layer material. The present disclosure provides several embodiments, including FinFET embodiments shown in FIGS. 3D, 5D, 7F, and 9E and MBC transistor embodiments shown in FIGS. 11F, 13F, 15F, and 16F. In addition, the present disclosure provides several methods for fabricating each of these embodiments. For example, the present disclosure provides a first method 200 shown in FIG. 2, a second method 300 shown in FIG. 4, a third method 400 shown in FIG. 6, a fourth method 500 shown in FIG. 8, a fifth method 600 shown in FIG. 10, a sixth method 700 shown in FIG. 12, and a seventh method 800 shown in FIG. 14. These methods are merely examples and are not intended to limit the present disclosure to what is explicitly illustrated therein. Additional steps can be provided before, during and after these methods, and some steps described can be replaced, eliminated, or moved around for additional embodiments of the methods. Not all steps are described herein in detail for reasons of simplicity. Each of these methods is described below in conjunction with fragmentary cross-sectional views along the section I-I' shown in FIG. 1. In this regard, the first method 200 is described below in conjunction with FIGS. 3A-3D. The second method 300 is described below in conjunction with FIGS. 5A-5D. The third method 400 is described below in conjunction with FIGS. 7A-7F. The fourth method 500 is described below in conjunction with FIGS. 9A-9E. The fifth method 600 is described below in conjunction with FIGS. 11A-11F. The sixth method 700 is described below in conjunction with FIGS. 13A-13F. The seventh method 800 is described below in conjunction with FIGS. 15A-15F as well as 16A-16F. Because section I-I' cuts through the gate structure 110, neither the gate spacer layer 118 nor the source/drain feature 108 in FIG. 1 is shown in these fragmentary cross-sectional views.

Figure 2:
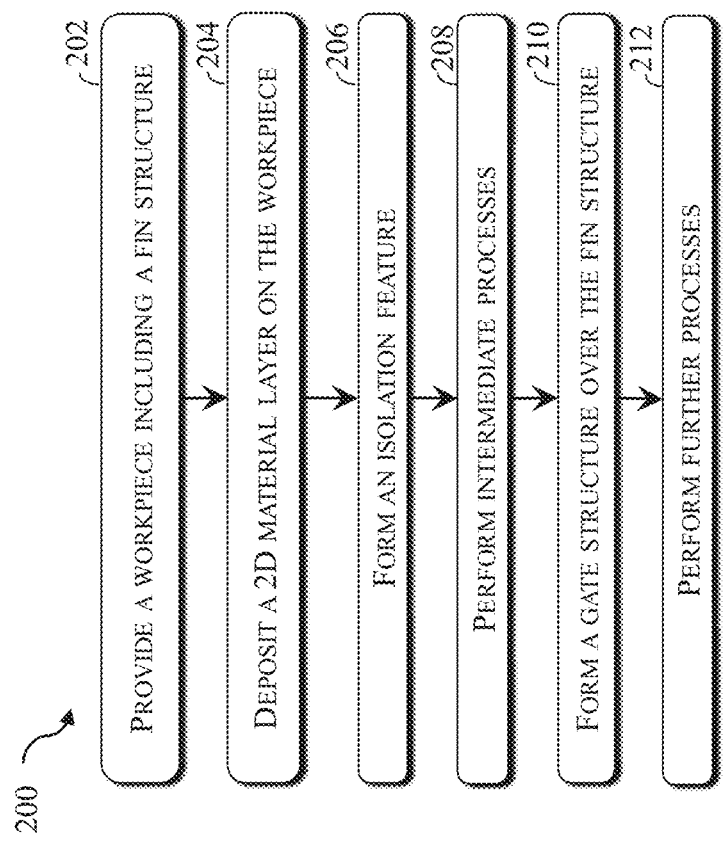
FIG. 2 illustrates a flowchart of a first method of fabricating a semiconductor device, according to one or more aspects of the present disclosure.

FIG. 2 illustrates a flowchart of a first method 200 for fabricating a FinFET. Referring to FIGS. 2 and 3A, the first method 200 includes a block 202 where a workpiece 100 is provided. As shown in FIG. 3A, the workpiece 100 includes a fin structure 103. The fin structure 103 in FIG. 3A may be formed from the substrate 102 and extend continuously from the substrate 102. As described above with respect to FIG. 1, the fin structure 103 extends lengthwise along the X direction. In some embodiments, the fin structure 103 may include silicon (Si), germanium (Ge), silicon germanium (SiGe), a III-V semiconductor material, or a II-VI semiconductor material. In some embodiments, the fin structure 103 may be doped with a dopant, such as phosphorus (P), arsenide (As), or boron (B). The fin structure 103 may have different thickness along the Y direction.

Referring to FIGS. 2 and 3B, the first method 200 includes a block 204 where a 2D material layer 1000 is deposited on the workpiece 100. As shown in FIG. 3B, at block 204, the 2D material layer 1000 is deposited over the fin structure 103. In some embodiments, the 2D material layer 1000 may include graphene, tungsten sulfide ($WS_2$), tungsten telluride ($WTe_2$), tungsten selenide ($WSe_2$), molybdenum sulfide ($MoS_2$), molybdenum telluride ($MoTe_2$), molybdenum selenide ($WSe_2$), black phosphorus, or a suitable 2D material that has substantial band alignment with the semiconductor material of the fin structure 103. Here, substantial band alignment refers to an overlap of the bandgap of the fin structure 103 and that of the 2D material. A bandgap of a material refers to a difference between a valence band (Ev) of the material and a conduction band (Ec) of the material. For example, silicon has a valance band at −5.17 eV, a conduction band at −4.05 eV, a bandgap of 1.12 eV between −5.17 eV and −4.05 eV. Tungsten telluride ($WTe_2$) has a valence band at about −4.5 eV, a conduction band at about −3.7 eV, and a bandgap of 0.8 eV between −4.5 eV and about −3.7 eV. In this example, as the bandgap of tungsten telluride overlaps with the bandgap of silicon, tungsten telluride and silicon have substantial band alignment. Like the fin structure 103, the 2D material layer may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). With respect to both the fin structure 103 and the 2D material layer 1000, electronic confinement due to film thickness and doping may affect the bandgaps and therefore the band alignment. The present disclosure envisions tuning of bandgaps using electronic confinement and doping to achieve band alignment between the fin structure 103 and the 2D material layer 1000. The bandgap alignment between the fin structure 103 and that of the 2D material may be achieved by doping the 2D materials with the foregoing dopants and/or by doping the fin structure 103 using n-type dopants, such as phosphorus (P), or p-type dopants, such as boron (B).

In some embodiments, the 2D material layer 1000 may be deposited over the workpiece 100 by epitaxial growth, chemical vapor deposition (CVD), atomic layer deposition (ALD), or a combination thereof. As shown in FIG. 3B, because the fin structure 103 and the substrate 102 are formed of the same material, the 2D material layer 1000 is deposited not only on the top surface and sidewall of the fin structure 103 but also on the top surface of the substrate 102. In some instances, the 2D material layer 1000 may have a thickness between about 1 Å and about 30 Å, such as between about 2 Å and about 10 Å. Compared to silicon, germanium, silicon germanium, a III-V semiconductor, or a II-VI semiconductor, 2D material of the 2D material layer 1000 has a higher density of states (DoS) due to its higher inversion charge density (Qinv).

Referring to FIGS. 2 and 3C, the first method 200 includes a block 206 where an isolation feature 106 is formed. In some embodiments, the isolation feature 106 may include a dielectric material such as silicon oxide, silicon nitride, silicon oxynitride, fluorine-doped silicate glass (FSG), a low-k dielectric, combinations thereof, and/or other suitable materials. In an example process, the dielectric material of the isolation feature 106 is first blanketly deposited over the workpiece 100 by spin-on coating or CVD. Thereafter, the blanketly deposited dielectric material is planarized in a planarization process, such as a chemical mechanical polishing (CMP) process. The planarized dielectric material is then selectively recessed or etched back such that the fin structure 103 rises above the isolation feature 106, as shown in FIG. 3C. At block 206, because the isolation feature 106 is formed after the deposition of the 2D material layer 1000, the isolation feature 106 is not in direct contact with sidewalls of base portion 104B and the top surface of the substrate 102. Put differently, the isolation feature 106 is spaced apart from the base portion 104B and the substrate 102 by the 2D material layer 1000. In FIG. 3C, the 2D material layer 1000 and the fin structure 103 that are not covered by the isolation feature 106 may be collectively referred to as a channel member 104.

Referring to FIG. 2, the first method 200 includes a block 208 where intermediate processes are performed. Although not explicitly shown, intermediate processes may be performed between the formation of the isolation feature 106 at block 206 and the formation of the gate structure 110 at block 210 (to be described below). In some embodiments where a gate replacement process flow is adopted, such intermediate processes may include formation of a dummy gate stack over the channel member 104, deposition of the gate spacer layer 118, etching back of the gate spacer layer 118, recessing of the source/drain region 104SD, deposition of the source/drain features 108, deposition of a contact etch stop layer (CESL) over the workpiece 100, deposition of an interlayer dielectric (ILD) layer over the workpiece 100, planarization of the ILD layer, and removal of the dummy gate stack. The removal of the dummy gate stack leaves behind a gate trench defined by the gate spacer layer 118. The gate structure 110 to be formed at block 210 is disposed in the gate trench.

Referring to FIGS. 2 and 3D, the first method 200 includes a block 210 where the gate structure 110 is formed over the channel member 104. As described above, the gate structure 110 may include an interfacial layer 112, a gate dielectric layer 114 over the interfacial layer 112, and a gate electrode 116 over the gate dielectric layer 114. The interfacial layer 112 of the gate structure 110 may include a dielectric material such as silicon oxide, hafnium silicate, or silicon oxynitride. In some embodiments, in order to better interface the 2D materials, the interfacial layer 112 may include hexagonal boron nitride. The gate dielectric layer 114 of the gate structure 110 may include a high-k dielectric material that has a dielectric material with a dielectric constant greater than that of silicon dioxide, which is about 3.9. In some instances, the gate dielectric layer 114 may include hafnium oxide, zirconium oxide, zirconium aluminum oxide, hafnium aluminum oxide, hafnium silicon oxide, aluminum oxide, titanium oxide, tantalum oxide, lanthanum oxide, yttrium oxide, tantalum carbonitride, zirconium nitride, combinations thereof, or other suitable material. In some instances, the gate dielectric layer 114 may have a thickness between about 5 nm and about 30 nm. The gate electrode 116 of the gate structure 110 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode 116 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In some embodiments, the interfacial layer 112 may be formed by thermal oxidation or deposited using CVD or ALD. The gate dielectric layer 114 may be deposited using CVD or ALD. The gate electrode 116 may be deposited using physical vapor deposition (PVD), CVD, ALD, or electroless plating.

As shown in FIG. 3D, the gate structure 110 is disposed over the channel member 104 that includes the fin structure 103 and the 2D material layer 1000. Due to the substantial band alignment between the 2D material layer 1000 and the fin structure 103, a single threshold voltage at the gate structure 110 may activate a channel in the fin structure 103 as well as a channel in the 2D material layer 1000. In this sense, the fin structure 103 above the isolation feature 106 functions as a first channel layer and the 2D material layer 1000 functions as a second channel layer. The channel formed in the fin structure 103 does not interact with the channel formed in the 2D material layer 1000. This is due to the 2D character of the 2D material layer 1000. Because 2D crystalline layers of the 2D material layer 1000 are held together by van der Waals force, not valence bonds, the band gap along a direction normal to the 2D crystalline plane may be orders of magnitude greater than that along a direction in the 2D crystalline plane. As the fin structure 103 is not in the 2D crystalline plane, the large band gap shields the 2D material layer 1000 from the fin structure 103 and vice versa. As a result, despite the fact that the 2D material layer 1000 is formed directly on the fin structure 103, fin structure 103 and the 2D material layer 1000 provide two independent channels that may be simultaneously activated by the same gate structure 110. Hence, the semiconductor device 100 may be referred to as a dual-channel transistors (DCTs), dual-channel field effect transistors (DCFETs), or dual-modality field effect transistor (DMFETs). Because current is allowed to flow in the channel formed in the fin structure 103 and the channel formed in the 2D material layer 1000 and the 2D material layer 1000 extends along the sidewalls of the fin structure 103, the effective channel width may be increased by a factor between about 1.8 and 2 and the On-state current may also be increased by a factor between about 1.8 and 2, compared to a similar semiconductor device that does not have the 2D material layer 1000 in the channel region.

Referring now to FIG. 2, the first method 200 includes a block 212 where further processes are performed. In some embodiments, such further processes may include formation of source/drain contacts, formation of gate contacts, formation of a further ILD layer, formation of source/drain contact vias, and formation of further interconnect structures.

The semiconductor device 100 may also be formed using a method like the second method 300 shown in FIG. 4. Referring to FIGS. 4 and 5A, the second method 300 includes a block 302 where a workpiece 100 is provided. As the workpiece 100 has been described above with respect to the first method 200, details of the workpiece 100 is omitted here for brevity.

Referring to FIGS. 4 and 5B, the second method 300 includes a block 304 where an isolation feature 106 is formed. Operations at block 304 is similar to those at block 206 in the first method 200, except that the isolation feature 106 is formed before the deposition of the 2D material layer 1000. Detailed descriptions of the composition and formation of the isolation feature 106 is omitted here for brevity. As shown in FIG. 5B, the isolation feature 106 is in direct contact with sidewalls of the base portion 104B and top surface of the substrate 102. No 2D material layer 1000 is disposed between the substrate 102 and the isolation feature 106.

Referring to FIGS. 4 and 5C, the second method 300 includes a block 306 where the 2D material layer 1000 is selectively deposited on the fin structure 103. Different from the operations at block 204 of the first method 200, deposition of the 2D material layer 1000 at block 306 is selective to the fin structure 103 and the 2D material layer 1000 does not substantially form over the isolation feature 106. In some implementations, the selective deposition may take place at a process temperature at which the 2D material layer 1000 does not deposit on the isolation feature 106 that has a greater lattice mismatch with the 2D material layer 1000. Rather, the 2D material layer 1000 is selectively deposited on the fin structure 103 that has a smaller lattice mismatch with the 2D material layer 1000. In some embodiments, the 2D material layer 1000 may include graphene, tungsten sulfide ($WS_2$), tungsten telluride ($WTe_2$), tungsten selenide ($WSe_2$), molybdenum sulfide ($MoS_2$), molybdenum telluride ($MoTe_2$), molybdenum selenide ($WSe_2$), black phosphorus, or a suitable 2D material that has substantial band alignment with the semiconductor material of the fin structure 103. The 2D material layer 1000 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). At block 306, the 2D material layer 1000 may be deposited using epitaxial growth or ALD. In FIG. 5C, the 2D material layer 1000 and the fin structure 103 that are not covered by the isolation feature 106 may be collectively referred to as a channel member 104.

Referring to FIG. 4, the second method 300 includes a block 308 where intermediate processes are performed. Example intermediate processes are described above and are omitted here for brevity.

Referring to FIGS. 4 and 5D, the second method 300 includes a block 310 where a gate structure 110 is formed over the channel member 104. As the composition and formation of the gate structure 110 has been described above with respect to block 210 of the first method 200 above, detailed description of the gate structure 110 is omitted here for brevity. Similar to the semiconductor device 100 shown in FIG. 3D, the gate structure 110 in FIG. 5D is disposed over the channel member 104 that includes the 2D material layer 1000 and the fin structure 103. The fin structure 103 and the 2D material layer 1000 provide two independent channels that may be simultaneously activated by the same gate structure 110. For similar reasons, the semiconductor device 100 in FIG. 5D is a DCFET. Because current is allowed to flow in the channel formed in the fin structure 103 and the channel formed in the 2D material layer 1000, the effective channel width may be increased by a factor between about 1.8 and 2 and the On-state current may also be increased by a factor between about 1.8 and 2, compared to a similar semiconductor device that does not have the 2D material layer 1000 in the channel region.

Referring now to FIG. 4, the second method 300 includes a block 312 where further processes are performed. In some embodiments, such further processes may include formation of source/drain contacts, formation of gate contacts, formation of a further ILD layer, formation of source/drain contact vias, and formation of further interconnect structures.

Figure 6:
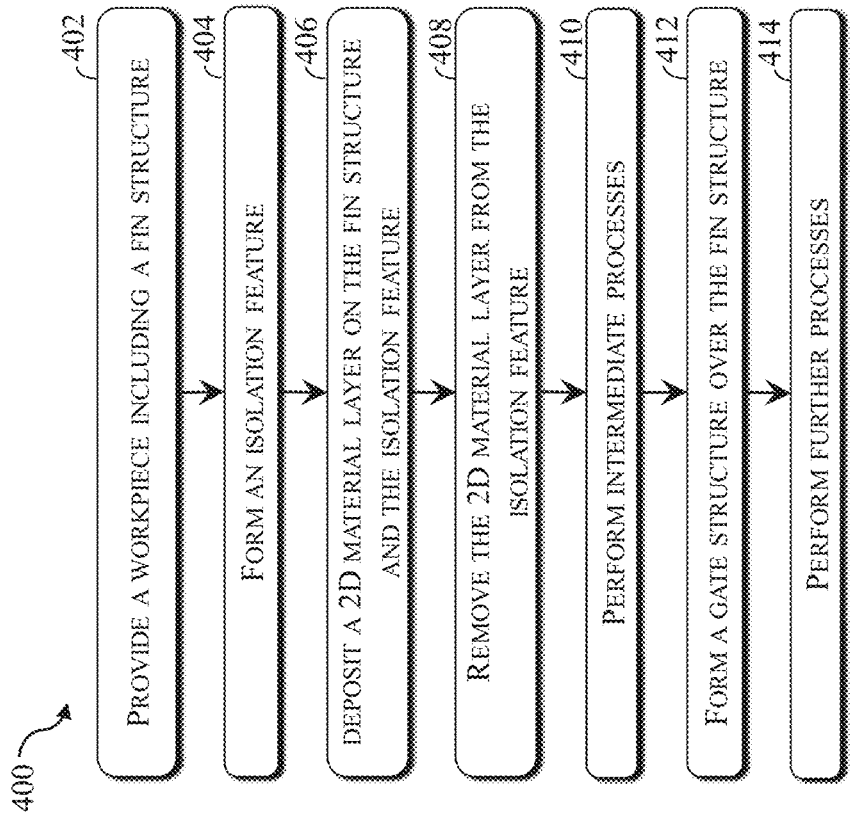
FIG. 6 illustrates a flowchart of a third method of fabricating a semiconductor device, according to one or more aspects of the present disclosure.

The semiconductor device 100 may also be formed using a method like the third method 400 shown in FIG. 6. Referring to FIGS. 6 and 7A, the third method 400 includes a block 402 where a workpiece 100 is provided. As the workpiece 100 has been described above with respect to the first method 200, details of the workpiece 100 is omitted here for brevity.

Referring to FIGS. 6 and 7B, the third method 400 includes a block 404 where an isolation feature 106 is formed. Operations at block 404 is similar to those at block 304 in the second method 300. Detailed descriptions of the composition and formation of the isolation feature 106 is omitted here for brevity. As shown in FIG. 7B, the isolation feature 106 is in direct contact with sidewalls of the base portion 104B and top surface of the substrate 102. No 2D material layer 1000 is disposed between the substrate 102 and the isolation feature 106.

Referring to FIGS. 6 and 7B, the third method 400 includes a block 406 where a 2D material layer 1000 is deposited on the fin structure 103 and the isolation feature 106. In some embodiments, the deposition at block 406 is not selective to the fin structure 103 and blanketly deposits the 2D material layer 1000 on the fin structure 103 and the top surface of the isolation feature 106. In some embodiments, the 2D material layer 1000 may include graphene, tungsten sulfide ($WS_2$), tungsten telluride ($WTe_2$), tungsten selenide ($WSe_2$), molybdenum sulfide ($MoS_2$), molybdenum telluride ($MoTe_2$), molybdenum selenide ($WSe_2$), black phosphorus, or a suitable 2D material that has substantial band alignment with the semiconductor material of the fin structure 103. The 2D material layer 1000 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). At block 406, the 2D material layer 1000 may be deposited using epitaxial growth, CVD or ALD.

Referring to FIGS. 6, 7C, 7D, and 7E, the third method 400 includes a block 408 where the 2D material layer 1000 is removed from the isolation feature 106. The third method 400 uses photolithography and etch processes to remove the 2D material layer 1000 from the top surface of the isolation feature 106. Referring to FIG. 7C, in an example process, a hard mask layer 119 is deposited over the workpiece 100 using CVD. The hard mask layer 119 may include a silicon oxide, silicon nitride, silicon oxynitride, or silicon carbonitride. A photoresist layer 120 is then deposited over the hard mask layer 119 using spin-on coating or CVD. The photoresist layer 120 is then baked in a pre-exposure bake process, exposed to a radiation transmitting through or reflected from a photolithography mask, baked in a post-exposure bake process, and developed in a developer solution, to form a patterned photoresist layer 120. The hard mask layer 119 is etched using the patterned photoresist layer 120 as an etch mask to form a patterned hard mask layer 119, as shown in FIG. 7D. Referring to FIG. 7E, the patterned hard mask layer 119 is applied as an etch mask to remove the 2D material layer 1000 on the top surface of the isolation feature 106. As shown in FIG. 7E, the 2D material layer 1000 and the fin structure 103 that are not covered by the isolation feature 106 may be collectively referred to as a channel member 104.

Referring to FIG. 6, the third method 400 includes a block 410 where intermediate processes are performed. Example intermediate processes are described above and are omitted here for brevity.

Referring now to FIGS. 6 and 7F, the third method 400 includes a block 412 where a gate structure 110 is formed over the channel member 104. As the composition and formation of the gate structure 110 has been described above with respect to block 210 of the first method 200 above, detailed description of the gate structure 110 is omitted here for brevity. Similar to the semiconductor device 100 shown in FIG. 3D, the gate structure 110 in FIG. 7F is disposed over both the 2D material layer 1000 and the fin structure 103. The fin structure 103 and the 2D material layer 1000 provide two independent channels that may be simultaneously activated by the same gate structure 110. For similar reasons, the semiconductor device 100 in FIG. 7F is a DCFET. Because current is allowed to flow in the channel formed in the fin structure 103 and the channel formed in the 2D material layer 1000, the effective channel width may be increased by a factor between about 1.8 and 2 and the On-state current may also be increased by a factor between about 1.8 and 2, compared to a similar semiconductor device that does not have the 2D material layer 1000 in the channel region.

Referring now to FIG. 6, the third method 400 includes a block 414 where further processes are performed. In some embodiments, such further processes may include formation of source/drain contacts, formation of gate contacts, formation of a further ILD layer, formation of source/drain contact vias, and formation of further interconnect structures.

Figure 8:
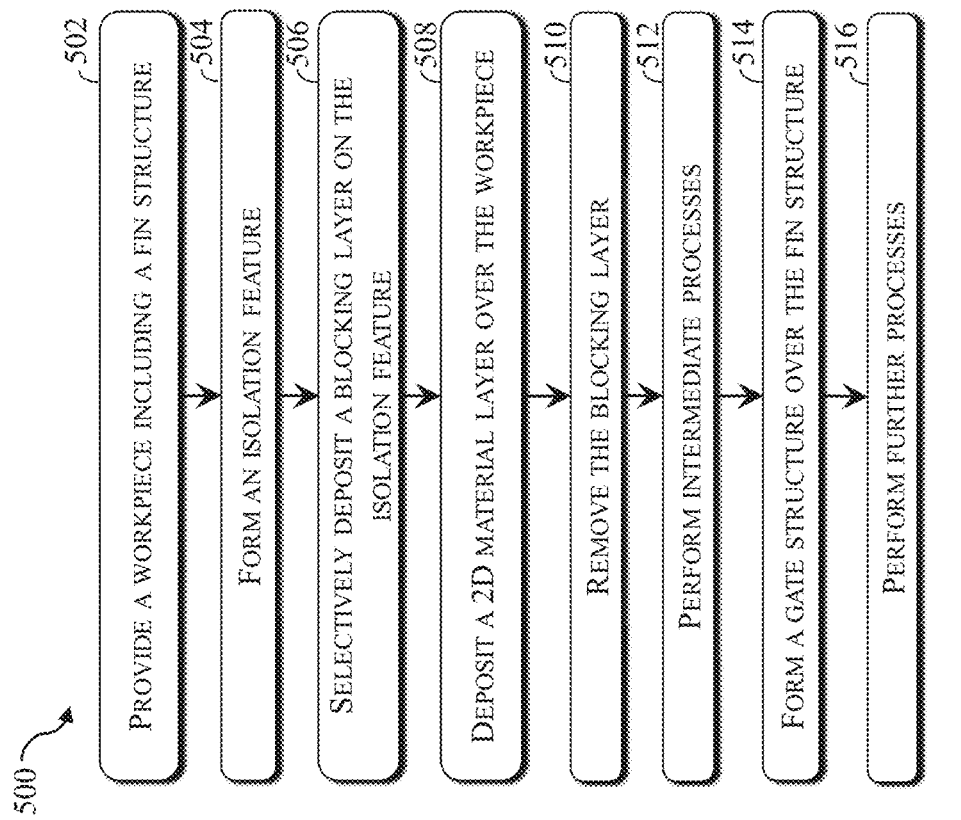
FIG. 8 illustrates a flowchart of a fourth method of fabricating a semiconductor device, according to one or more aspects of the present disclosure.

The semiconductor device 100 in FIG. 1 may also be formed using a method like the fourth method 500 shown in FIG. 8. Referring to FIGS. 8 and 9A, the fourth method 500 includes a block 502 where a workpiece 100 is provided. As the workpiece 100 has been described above with respect to the first method 200, details of the workpiece 100 is omitted here for brevity.

Referring to FIGS. 8 and 9B, the fourth method 500 includes a block 504 where an isolation feature 106 is formed. Operations at block 504 is similar to those at block 304 in the second method 300. Detailed descriptions of the composition and formation of the isolation feature 106 is omitted here for brevity. As shown in FIG. 9B, the isolation feature 106 is in direct contact with sidewalls of the base portion 104B and top surface of the substrate 102. As shown in FIG. 9B, no 2D material layer 1000 is disposed between the substrate 102 and the isolation feature 106.

Referring to FIGS. 8 and 9B, the fourth method 500 includes a block 506 where a blocking layer 122 is selectively deposited on the isolation feature 106. In some embodiments, precursors for the blocking layer 122 may include a silane-based compound without bulking steric hindrance functional groups. An example blocking layer 122 may include N-Trimethylsilylpyrrole ($C_7H_{13}NSi$), octadecyltrichlorosilane (ODTS, $C_{18}H_{37}Cl_3Si$), trimethylchlorosilane (TMCS, also known as trimethylsilylchloride, ($CH_3)_3SiCl$), or other suitable compounds. In some implementations, the precursors for the blocking layer 122 are configured to react with and bond to the hydroxyl groups commonly found on surfaces of the isolation feature 106. As a result, the precursors for the blocking layer 122 are allowed to selectively form on the top surface of the isolation feature 106, instead of the fin structure 103, as shown in FIG. 9B.

Referring to FIGS. 8 and 9C, the fourth method 500 includes a block 508 where a 2D material layer 1000 is deposited on the fin structure 103. In some embodiments, the blocking layer 122 may prevent deposition of the 2D material layer 1000 on the isolation feature 106. As a result, the 2D material layer 1000 is allowed to selectively deposit on the fin structure 103. In some embodiments, the 2D material layer 1000 may include graphene, tungsten sulfide ($WS_2$), tungsten telluride ($WTe_2$), tungsten selenide ($WSe_2$), molybdenum sulfide ($MoS_2$), molybdenum telluride ($MoTe_2$), molybdenum selenide ($WSe_2$), black phosphorus, or a suitable 2D material that has substantial band alignment with the semiconductor material of the fin structure 103. The 2D material layer 1000 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). At block 508, the 2D material layer 1000 may be deposited using epitaxial growth, CVD or ALD.

Referring to FIGS. 8 and 9D, the fourth method 500 includes a block 510 where the blocking layer 122 is removed. In some embodiments, after the 2D material layer 1000 is deposited, the blocking layer 122 may be removed by chemical stripping or annealing. In an example chemical stripping process, a gas species that is reactive with the blocking layer 122 may be put in contact with the workpiece 100 and the blocking layer 122 is converted to a volatile species. In an example annealing process, the bonding between the blocking layer 122 and the isolation feature 106 may be severed by thermal energy provided during the annealing process. As shown in FIG. 9D, the 2D material layer 1000 and the fin structure 103 that are not covered by the isolation feature 106 may be collectively referred to as a channel member 104.

Referring to FIG. 8, the fourth method 500 includes a block 512 where intermediate processes are performed. Example intermediate processes are described above and are omitted here for brevity.

Referring now to FIGS. 8 and 9E, the fourth method 500 includes a block 514 where a gate structure 110 is formed over the channel member 104. As the composition and formation of the gate structure 110 has been described above with respect to block 210 of the first method 200 above, detailed description of the gate structure 110 is omitted here for brevity. Similar to the semiconductor device 100 shown in FIG. 3D, the gate structure 110 in FIG. 9E is disposed over the channel member 104 that includes the 2D material layer 1000 and the fin structure 103. The fin structure 103 and the 2D material layer 1000 provide two independent channels that may be simultaneously activated by the same gate structure 110. For similar reasons, the semiconductor device 100 in FIG. 9E is a DCFET. Because current is allowed to flow in the channel formed in the fin structure 103 and the channel formed in the 2D material layer 1000, the effective channel width may be increased by a factor between about 1.8 and 2 and the On-state current may also be increased by a factor between about 1.8 and 2, compared to a similar semiconductor device that does not have the 2D material layer 1000 in the channel region.

Referring now to FIG. 8, the fourth method 500 includes a block 516 where further processes are performed. In some embodiments, such further processes may include formation of source/drain contacts, formation of gate contacts, formation of a further ILD layer, formation of source/drain contact vias, and formation of further interconnect structures.

Figure 10:
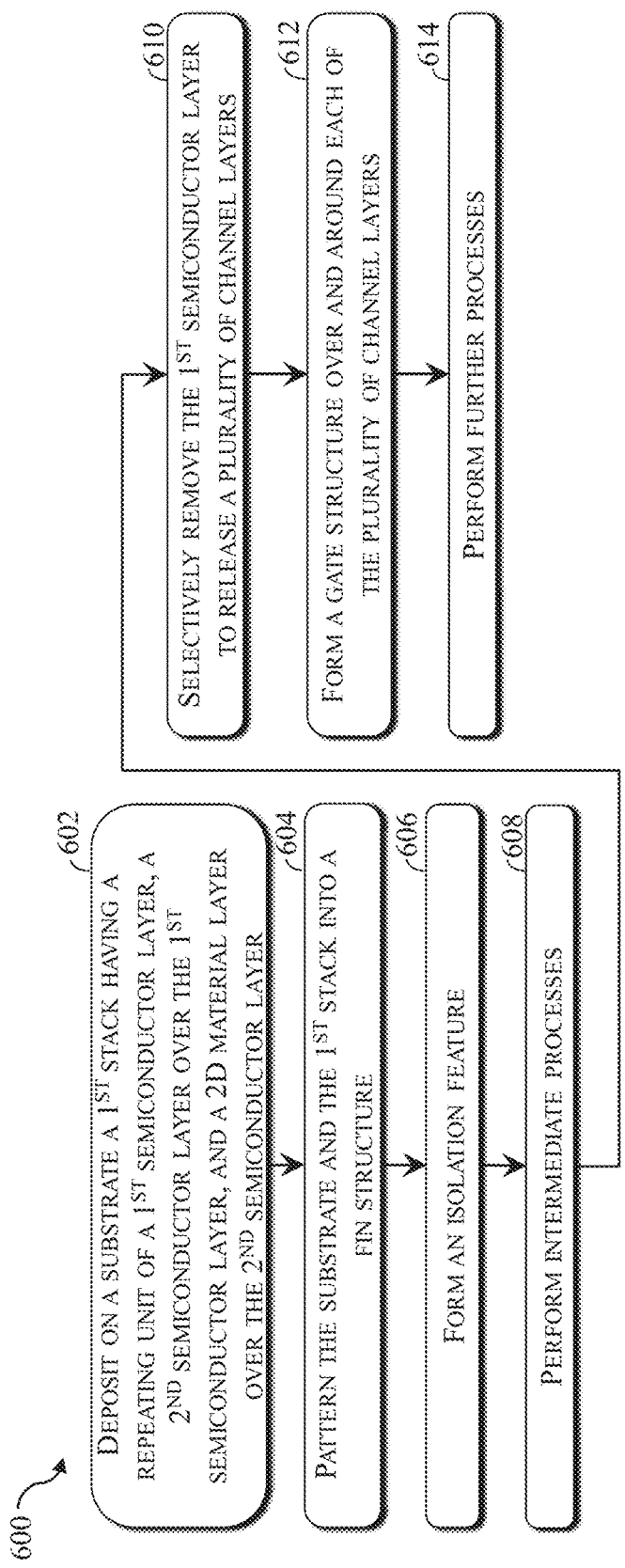
FIG. 10 illustrates a flowchart of a fifth method of fabricating a semiconductor device, according to one or more aspects of the present disclosure.

When the semiconductor device 100 in FIG. 1 is an MBC transistor, the semiconductor device 100 may also be formed using a method like the fifth method 600 shown in FIG. 10. Referring to FIGS. 10 and 11A, the fifth method 600 includes a block 602 where a first stack 1100 is deposited on a substrate 102. As shown in FIG. 11A, the first stack 1100 includes a plurality of repeating units, each of which includes a first semiconductor layer 124, a second semiconductor layer 126, and a 2D material layer 1000. In the embodiments represented in FIG. 11A, the first stack 1100 includes three repeating units each having a first semiconductor layer 124, a second semiconductor layer 126, and a 2D material layer 1000. In some embodiments, the first semiconductor layer 124 may be referred to as a sacrificial layer 124 and may include silicon germanium (SiGe). In some embodiments, the second semiconductor layer 126 may be referred to a channel layer 126 and may include silicon (Si). In some implementations, the 2D material layer 1000 may include graphene, tungsten sulfide ($WS_2$), tungsten telluride ($WTe_2$), tungsten selenide ($WSe_2$), molybdenum sulfide ($MoS_2$), molybdenum telluride ($MoTe_2$), molybdenum selenide ($WSe_2$), black phosphorus, or a suitable 2D material that has substantial band alignment with the semiconductor material of the second semiconductor layer 126. The 2D material layer 1000 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). At block 602, the first semiconductor layer 124, the second semiconductor layer 126, and the 2D material layer 1000 may be deposited using epitaxial growth.

Referring to FIGS. 10 and 11B, the fifth method 600 includes a block 604 where the substrate 102 and the first stack 1100 are patterned into a first fin-like structure 1040. As shown in FIG. 11B, the first fin-like structure 1040 includes the base portion 104B and a top portion formed from the first stack 1100. The first fin-like structure 1040 extends lengthwise along the X direction. The top portion therefore includes the sacrificial layers 124, the channel layers 126, and the 2D material layers. In some embodiments, the patterning at block 604 may include an anisotropic etching process, such as a reactive-ion etching (RIE) process. An example RIE process may use a fluorocarbon such as carbon tetrafluoride ($CF_4$), trifluoromethane ($CHF_3$), octafluoropropane ($C_3F_8$), or sulfur hexafluoride ($SF_6$).

Referring to FIGS. 10 and 11C, the fifth method 600 includes a block 606 where an isolation feature 106 is formed. In some embodiments, the isolation feature 106 may include a dielectric material such as silicon oxide, silicon nitride, silicon oxynitride, fluorine-doped silicate glass (FSG), a low-k dielectric, combinations thereof, and/or other suitable materials. In an example process, the dielectric material of the isolation feature 106 is first blanketly deposited over the workpiece 100, including the first fin-like structure 1040, by spin-on coating or CVD. Thereafter, the blanketly deposited dielectric material is planarized in a planarization process, such as a chemical mechanical polishing (CMP) process. The planarized dielectric material is then selectively recessed or etched back such only the base portion 104B is disposed in the isolation feature 106, as shown in FIG. 11C. The isolation feature 106 is in direct contact with sidewalls of base portion 104B and the top surface of the substrate 102.

Referring to FIG. 10, the fifth method 600 includes a block 608 where intermediate processes are performed. With respect to the fifth method 600, such intermediate processes may include deposition of a dummy gate stack over the first fin-like structure 1040, formation of gate spacer layers over the dummy gate stack, recessing of the source/drain region 104SD of the first fin-like structure 1040 to form source/drain recesses, lateral recessing of the sacrificial layers 124 to form inner spacer recesses, forming inner spacer features in the inner spacer recesses, forming source/drain features in the source/drain recesses, depositing an ILD layer over the source/drain features, and removing of the dummy gate stack to expose the top portion of the first fin-like structure 1040 in the channel region 104C. As will be described below, the removal of the dummy gate stack sets the stage for the operations at block 610.

Referring to FIGS. 10 and 11D, the fifth method 600 includes a block 610 where the first semiconductor layers 124 are selectively removed to release the plurality of second semiconductor layers 126 and the 2D material layers 1000. In embodiments where the first semiconductor layer 124 is formed of silicon germanium and the second semiconductor layer 126 is formed of silicon, the selective removal of the first semiconductor layers 124 may include a SiGe oxidation process followed by a SiGe oxide removal. In those embodiments, the SiGe oxidation process may include use of ozone. In some implementations, the selective removal of the first semiconductor layer 124 may include use of a selective isotropic etching process (e.g., a selective dry etching process or a selective wet etching process). In some embodiments, the selective dry etching process may include use of one or more fluorine-based etchants, such as fluorine gas or hydrofluorocarbons. In some embodiments, the selective wet etching process may include a hydro fluoride (HF) or $NH_4OH$ etchant. As shown in FIG. 11D, due to the arrangement of the repeating unit in the first stack 1100, the removal of the first semiconductor layers 124 (i.e., sacrificial layers 124) releases a plurality of channel members 104. Each of the channel members 104 includes a second semiconductor layer 126 (i.e., a channel layer 126) and a 2D material layer 1000.

Referring to FIGS. 10, 11E and 11F, the fifth method 600 includes a block 612 where a gate structure 110 is formed over and around each of the plurality of channel members 104. As described above, the gate structure 110 may include an interfacial layer 112, a gate dielectric layer 114 over the interfacial layer 112, and a gate electrode 116 over the gate dielectric layer 114. As the compositions of the interfacial layer 112, the gate dielectric layer 114, and the gate electrode 116 have been described above respect to block 210 of the first method 200, detailed description of the interfacial layer 112, the gate dielectric layer 114, and the gate electrode 116 are omitted here for brevity. As shown in FIG. 11E, the interfacial layer 112 and the gate dielectric layer 114 may be sequentially deposited around the channel members 104 using CVD or ALD. Then, as shown in FIG. 11F, the gate electrode 116 may be deposited using PVD, CVD, ALD, or electroless plating. Due to the 2D properties of the 2D material layer 1000 described above, the channel layer 126 in each of the channel members 104 functions as a first channel layer and the 2D material layer 1000 in each of the channel members 104 functions as a second channel layer. The first channel layer and the second channel layer may be simultaneously and independently turned on due to substantial band alignment. For similar reasons, the semiconductor device 100 in FIG. 11F is a DCFET. Because current is allowed to flow in the channel formed in the channel layers 126 and the channel formed in the 2D material layer 1000, the effective channel width of each of the channel members 104 may be increased by a factor between about 1.2 and 1.5 and the On-state current may also be increased by a factor between about 1.2 and 1.5, compared to a similar semiconductor device that does not have the 2D material layer 1000 in the channel region.

Referring now to FIG. 10, the fifth method 600 includes a block 614 where further processes are performed. In some embodiments, such further processes may include formation of source/drain contacts, formation of gate contacts, formation of a further ILD layer, formation of source/drain contact vias, and formation of further interconnect structures.

Figure 12:
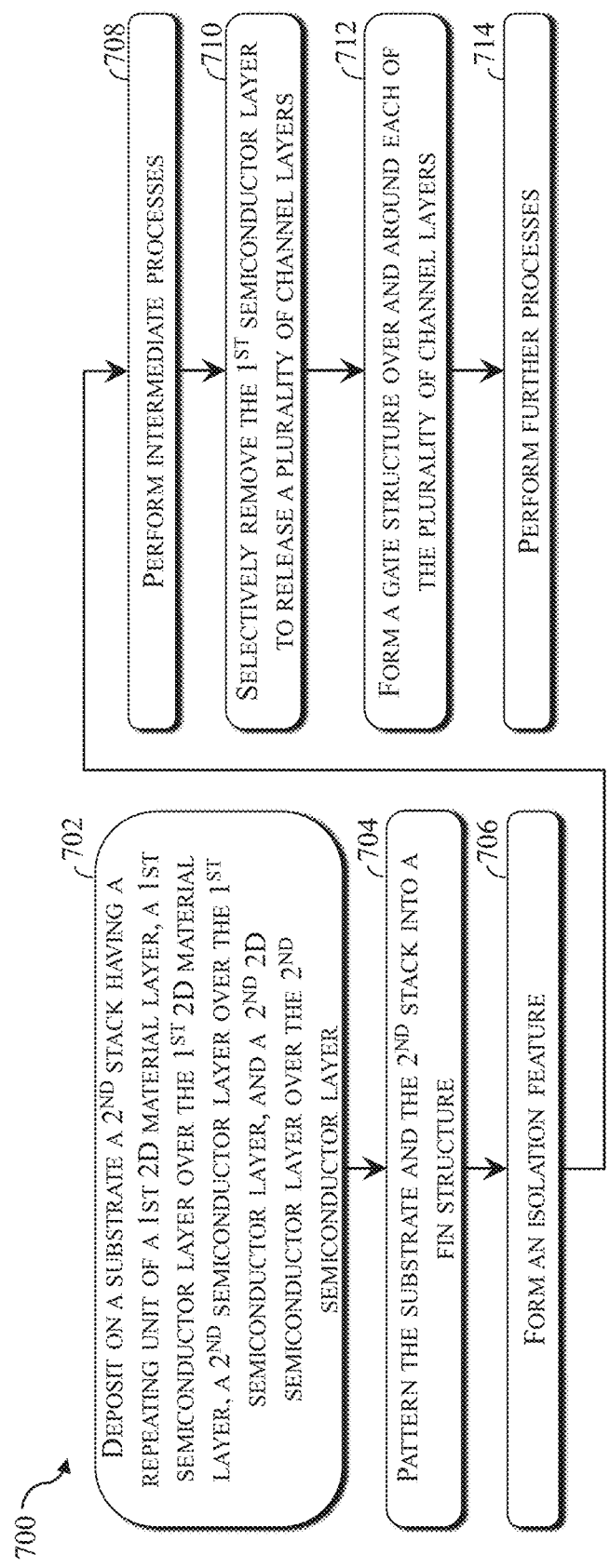
FIG. 12 illustrates a flowchart of a sixth method of fabricating a semiconductor device, according to one or more aspects of the present disclosure.

The semiconductor device 100 may also be formed using a method like the sixth method 700 shown in FIG. 12. Referring to FIGS. 12 and 13A, the sixth method 700 includes a block 702 where a second stack 1200 is deposited on a substrate 102. As shown in FIG. 13A, the second stack 1200 includes a plurality of repeating units, each of which includes a first semiconductor layer 124, a 2D material layer 1000 over the first semiconductor layer, a second semiconductor layer 126 over the 2D material layer 1000, and another 2D material layer 1000 over the second semiconductor layer 126. Put differently, each of the second semiconductor layers 126 is directly sandwiched between two 2D material layers. In the embodiments represented in FIG. 13A, the second stack 1200 includes three repeating units each having a second semiconductor layer 126 sandwiched between two 2D material layers 1000 and adjacent 2D material layers 1000 are spaced apart by a first semiconductor layer 124. In some embodiments, the first semiconductor layer 124 may be referred to as a sacrificial layer 124 and may include silicon germanium (SiGe) and the second semiconductor layer 126 may be referred to a channel layer 126 and may include silicon (Si). In some implementations, the 2D material layer 1000 may include graphene, tungsten sulfide ($WS_2$), tungsten telluride ($WTe_2$), tungsten selenide ($WSe_2$), molybdenum sulfide ($MoS_2$), molybdenum telluride ($MoTe_2$), molybdenum selenide ($WSe_2$), black phosphorus, or a suitable 2D material that has substantial band alignment with the semiconductor material of the second semiconductor layer 126. The 2D material layer 1000 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). At block 702, the first semiconductor layer 124, the second semiconductor layer 126, and the 2D material layer 1000 may be deposited using epitaxial growth.

Referring to FIGS. 12 and 13B, the sixth method 700 includes a block 704 where the substrate 102 and the second stack 1200 are patterned into a second fin-like structure 1042. As shown in FIG. 13B, the second fin-like structure 1042 includes the base portion 104B and a top portion formed from the second stack 1200. The second fin-like structure 1042 extends lengthwise along the X direction. The top portion therefore includes the sacrificial layers 124, the channel layers 126, and 2D material layers 1000 sandwiching the channel layers 126. In some embodiments, the patterning at block 704 may include an anisotropic etching process, such as a reactive-ion etching (RIE) process. An example RIE process may use a fluorocarbon such as carbon tetrafluoride ($CF_4$), trifluoromethane ($CHF_3$), octafluoropropane ($C_3F_8$), or sulfur hexafluoride ($SF_6$).

Referring to FIGS. 12 and 13C, the sixth method 700 includes a block 706 where an isolation feature 106 is formed. As the operations at block 706 is similar to those at block 606, detailed description of operations at block 706 is omitted for brevity.

Referring to FIG. 12, the sixth method 700 includes a block 708 where intermediate processes are performed. As the operations at block 708 is similar to those at block 608, detailed description of operations at block 708 is omitted for brevity.

Referring to FIGS. 12 and 13D, the sixth method 700 includes a block 710 where the first semiconductor layers 124 are selectively removed to release the plurality of second semiconductor layers 126 and the 2D material layers 1000. In embodiments where the first semiconductor layer 124 is formed of silicon germanium and the second semiconductor layer 126 is formed of silicon, the selective removal of the first semiconductor layers 124 may include a SiGe oxidation process followed by a SiGe oxide removal. In those embodiments, the SiGe oxidation process may include use of ozone. In some implementations, the selective removal of the first semiconductor layer 124 may include use of a selective isotropic etching process (e.g., a selective dry etching process or a selective wet etching process). In some embodiments, the selective dry etching process may include use of one or more fluorine-based etchants, such as fluorine gas or hydrofluorocarbons. In some embodiments, the selective wet etching process may include a hydro fluoride (HF) or $NH_4OH$ etchant. As shown in FIG. 13D, due to the arrangement of the repeating unit in the second stack 1200, the removal of the first semiconductor layers 124 (i.e., sacrificial layers 124) releases a plurality of channel members 104. Each of the channel members 104 includes a second semiconductor layer 126 (i.e., a channel layer 126) vertically sandwiched between two 2D material layer 1000.

Referring to FIGS. 12, 13E and 13F, the sixth method 700 includes a block 712 where a gate structure 110 is formed over and around each of the plurality of channel members 104. As the operations at block 712 is similar to those at block 612, detailed description of operations at block 712 is omitted for brevity. Due to the 2D properties of the 2D material layer 1000 described above, the channel layer 126 in each of the channel members 104 functions as a first channel layer and two 2D material layers 1000 in each of the channel members 104 function as two second channel layers. The first channel layer and the two second channel layers may be simultaneously and independently turned due to substantial band alignment. For similar reasons, the semiconductor device 100 in FIG. 13F is a DCFET. Because current is allowed to flow in the channel formed in the channel layers 126 and the channels formed in the 2D material layers 1000, the effective channel width of each of the channel members 104 may be increased by a factor between about 1.8 and 2 and the On-state current may also be increased by a factor between about 1.8 and 2, compared to a similar semiconductor device that does not have the 2D material layer 1000 in the channel region.

Referring now to FIG. 12, the sixth method 700 includes a block 714 where further processes are performed. In some embodiments, such further processes may include formation of source/drain contacts, formation of gate contacts, formation of a further ILD layer, formation of source/drain contact vias, and formation of further interconnect structures.

In the fifth method 600 and the sixth method 700, 2D material layers 1000 are integrated into the epitaxial stacks that are patterned into channel members 104. In some alternative embodiments represented in the seventh method 800 in FIG. 14, the channel layers in an epitaxial stack are patterned and released and then a 2D material layer 1000 is deposited around each of the released channel layers to form channel members 104.

Figure 14:
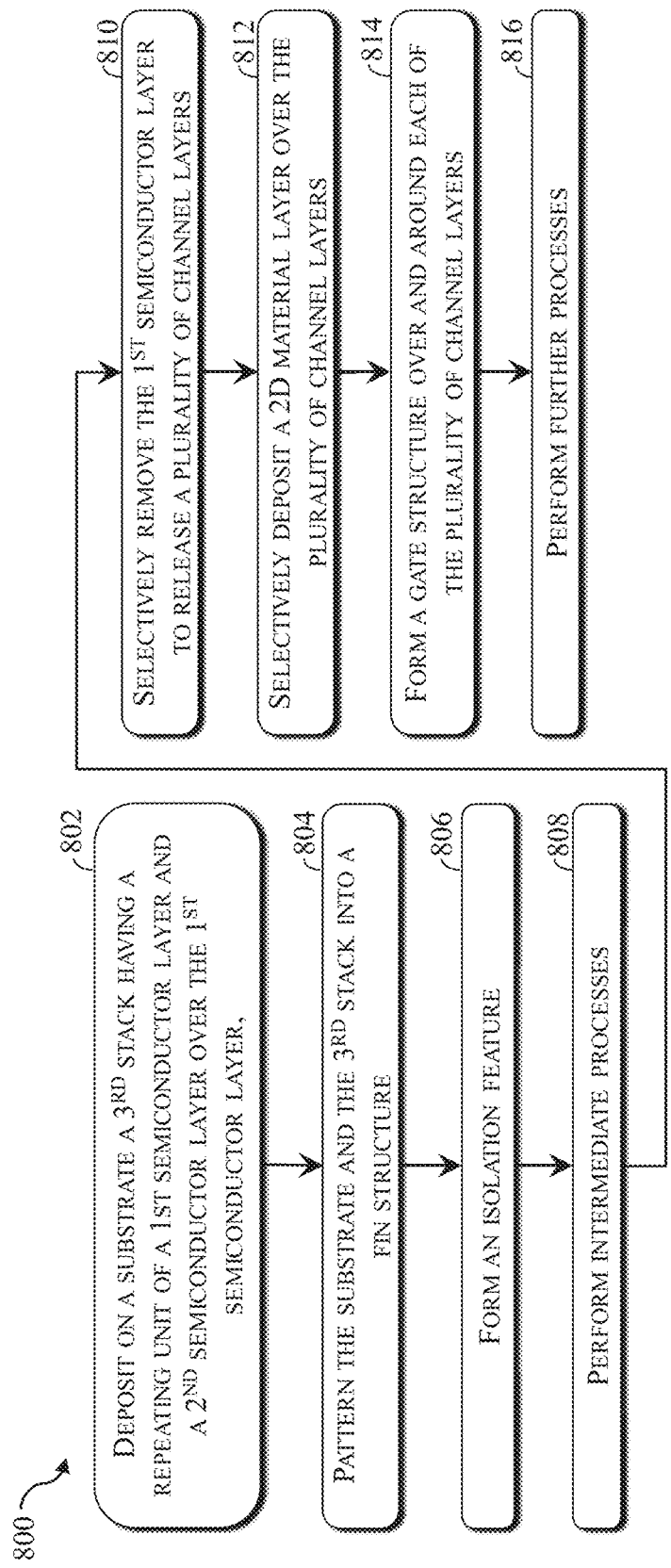
FIG. 14 illustrates a flowchart of a seventh method of fabricating a semiconductor device, according to one or more aspects of the present disclosure.

Referring to FIGS. 14 and 15A, the seventh method 800 includes a block 802 where a third stack 1300 is deposited on a substrate 102. As shown in FIG. 13A, the third stack 1300 includes a plurality of first semiconductor layer 124 interposed by a plurality of second semiconductor layers 126. It is noted that, different from the first stack 1100 and the second stack 1200, the third stack 1300 is free of any 2D material layers. In some embodiments, the first semiconductor layer 124 may be referred to as a sacrificial layer 124 and may include silicon germanium (SiGe), and the second semiconductor layer 126 may be referred to a channel layer 126 and may include silicon (Si). At block 802, the first semiconductor layer 124 and the second semiconductor layer 126 may be deposited using epitaxial growth.

Referring to FIGS. 14 and 15B, the seventh method 800 includes a block 804 where the substrate 102 and the third stack 1300 are patterned into a third fin-like structure 1044. As shown in FIG. 15B, the third fin-like structure 1044 includes the base portion 104B and a top portion formed from the third stack 1300. The third fin-like structure 1044 extends lengthwise along the X direction. The top portion therefore includes the sacrificial layers 124 and the channel layers 126 and is free of any 2D material layers. In some embodiments, the patterning at block 804 may include an anisotropic etching process, such as a reactive-ion etching (RIE) process. An example RIE process may use a fluorocarbon such as carbon tetrafluoride ($CF_4$), trifluoromethane ($CHF_3$), octafluoropropane ($C_3F_8$), or sulfur hexafluoride ($SF_6$).

Referring to FIGS. 14 and 15C, the seventh method 800 includes a block 806 where an isolation feature 106 is formed. As the operations at block 806 is similar to those at block 606, detailed description of operations at block 806 is omitted for brevity.

Referring to FIG. 14, the seventh method 800 includes a block 808 where intermediate processes are performed. As the operations at block 808 is similar to those at block 608, detailed description of operations at block 808 is omitted for brevity.

Referring to FIGS. 14 and 15D, the seventh method 800 includes a block 810 where the first semiconductor layers 124 are selectively removed to release the plurality of second semiconductor layers 126. In embodiments where the first semiconductor layer 124 is formed of silicon germanium and the second semiconductor layer 126 is formed of silicon, the selective removal of the first semiconductor layers 124 may include a SiGe oxidation process followed by a SiGe oxide removal. In those embodiments, the SiGe oxidation process may include use of ozone. In some implementations, the selective removal of the first semiconductor layer 124 may include use of a selective isotropic etching process (e.g., a selective dry etching process or a selective wet etching process). In some embodiments, the selective dry etching process may include use of one or more fluorine-based etchants, such as fluorine gas or hydrofluorocarbons. In some embodiments, the selective wet etching process may include a hydro fluoride (HF) or $NH_4OH$ etchant.

Referring to FIGS. 14 and 15E, the seventh method 800 includes a block 812 where a 2D material layer 1000 is selectively deposited on surfaces of the released channel layers 126 (i.e., the second semiconductor layer 126). As shown in FIG. 15E, deposition of the 2D material layer 1000 at block 812 is selective to the released channel layers 126 and top surface of the base portion 104B. That is, at block 812, the 2D material layer 1000 is not substantially deposited on the isolation feature 106. In some implementations, the selective deposition may take place at a process temperature at which the 2D material layer 1000 does not deposit on the isolation feature 106 that has a greater lattice mismatch with the 2D material layer 1000. Rather, the 2D material layer 1000 is selectively deposited on the channel layers 126 and base portion 104B that have a smaller lattice mismatch with the 2D material layer 1000. In some embodiments, the 2D material layer 1000 may include graphene, tungsten sulfide ($WS_2$), tungsten telluride ($WTe_2$), tungsten selenide ($WSe_2$), molybdenum sulfide ($MoS_2$), molybdenum telluride ($MoTe_2$), molybdenum selenide ($WSe_2$), black phosphorus, or a suitable 2D material that has substantial band alignment with the semiconductor material of the channel layers 126. The 2D material layer 1000 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). At block 812, the 2D material layer 1000 may be deposited using epitaxial growth or ALD. As shown in FIG. 15E, because the released channel layers 126 are suspended, the 2D material layer 1000 deposited at block 812 wraps around each of the released channel layers 126. Upon conclusion of operations at block 812, a channel member 104 is formed. Each of the channel members 104 includes a patterned channel layer 126 wrapped around by a 2D material layer 1000. As shown in FIG. 15E, the X-direction cross-section of the channel member 104 resembles a coaxial cable.

Referring to FIGS. 14 and 15F, the seventh method 800 includes a block 814 where a gate structure 110 is formed over and around each of the plurality of channel members 104. As the operations at block 814 is similar to those at block 612, detailed description of operations at block 814 is omitted for brevity. Due to the 2D properties of the 2D material layer 1000 described above, the channel layer 126 in each of the channel members 104 functions as a first channel layer and the 2D material layer 1000 in each of the channel members 104 function as a second channel layer. The first channel layer and the second channel layer may be simultaneously and independently turned on due to substantial band alignment. For similar reasons, the semiconductor device 100 in FIG. 15F is a DCFET. Because current is allowed to flow in the channel formed in the channel layers 126 and the channels formed in the 2D material layers 1000, the effective channel width of each of the channel members 104 may be increased by a factor between about 1.8 and 2 and the On-state current may also be increased by a factor between about 1.8 and 2, compared to a similar semiconductor device that does not have the 2D material layer 1000 in the channel region.

Referring now to FIG. 14, the seventh method 800 includes a block 816 where further processes are performed. In some embodiments, such further processes may include formation of source/drain contacts, formation of gate contacts, formation of a further ILD layer, formation of source/drain contact vias, and formation of further interconnect structures.

The seventh method 800 may be applied to form nanosheet transistors, as illustrated fragmentary cross-sectional views in FIGS. 15A-15F as well as nanowire transistors, as illustrated in fragmentary cross-sectional views in FIGS. 16A-16F. Nanosheet transistors and nanowire transistors are different mainly in terms of dimensional ratios of their channel members. In a nanosheet transistor embodiment shown in FIG. 15D, each of the released channel layers 126 include a first width W1 along the Y direction and a first height H1 along the Z direction. In some instances, a ratio of the first width W1 to the first height H1 is equal to or greater than 1.5 and each of the released channel layers 126 as well as the channel members 104 in FIG. 15F resembles a sheet. In nanowire transistor embodiments shown in FIG. 16D, each of the released channel layers 126 includes a second width W2 along the Y direction and a second height H2 along the Z direction. In some instances where a ratio of the second width W2 to the second height H2 is smaller than 1.5, each of the released channel layers 126 as well as the channel members 104 in FIG. 16F resembles a wire. Other than the differences dimensional ratios, the workpiece 100 and features illustrated in FIGS. 16A-16F are similar to those illustrated in FIGS. 15A-15F. Detailed description of FIGS. 16A-16F are omitted for brevity.

In some instances, a semiconductor device according to the present application may have different device regions to accommodate transistors of different conductivity types. Due to material properties and process constraints, different types of transistors may have different drive current levels. This imbalance of drive currents may pose circuit design challenges and may impact device performance. To even out drive currents of different types of devices, DCFETs may be selectively implemented in one device region but not in the other device region. Alternatively, different DCFETs may be implemented in different device regions. In some instances, DCFETs may be selectively implemented in one device region for high drive current applications but not in the other device region for different applications. Example embodiments are illustrated in FIGS. 17-20 and described below.

Figure 17:
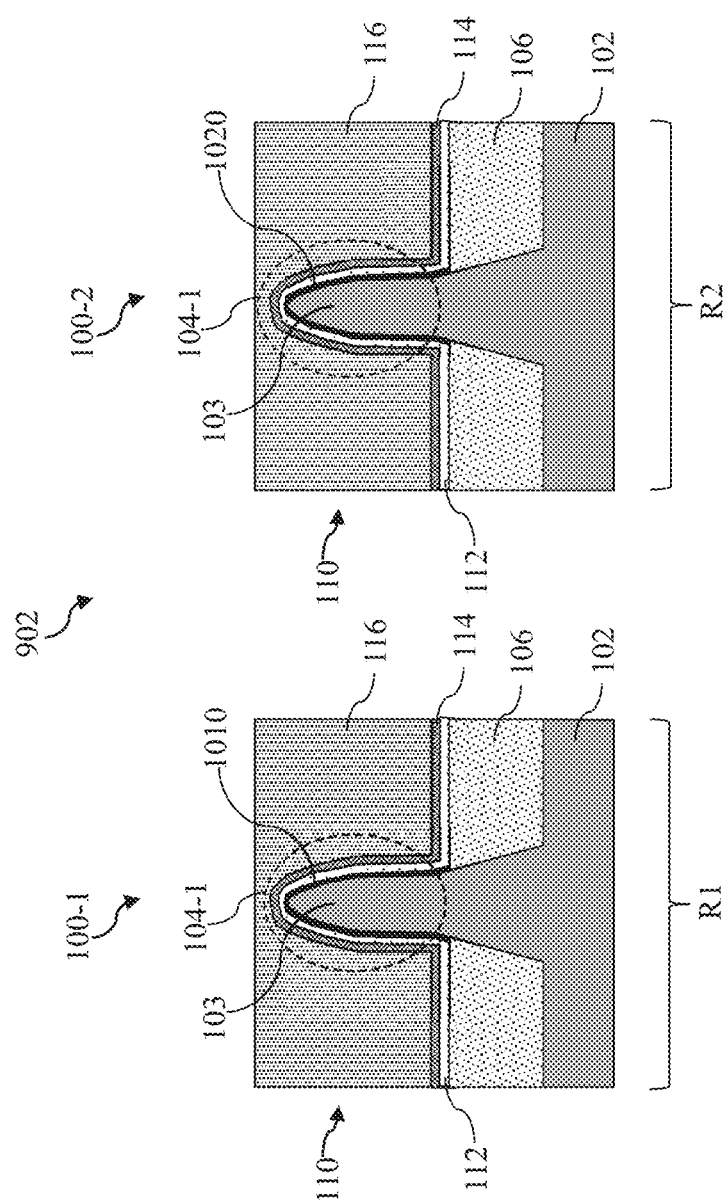
FIGS. 17-20 illustrate example implementations of different transistors in a first region and a second region of a semiconductor device, according to one or more aspects of the present disclosure.

Referring first to FIG. 17, which schematically illustrates a first integrated circuit (IC) device 902 that has a first device region R1 and a second device region R2. In some embodiments, the first device region R1 is an n-type device region and the second device region R2 is a p-type device region. The first device region R1 includes a first transistor 100-1 and the second device region R2 includes a second transistor 100-2. Each of the first transistor 100-1 and the second transistor 100-2 may be a dual-channel FinFET having a structure similar to those illustrated in FIGS. 3D, 5D, 7F, and 9E and detailed descriptions of various features of them are omitted for brevity. In the example illustrated in FIG. 17, the first transistor 100-1 includes a first channel member 104-1 having a first 2D material layer 1010 disposed on a fin structure 103 and the second transistor 100-2 includes a second channel member 104-2 having second 2D material layer 1020 disposed on a fin structure 103. The first 2D material layer 1010 is different from the second 2D material layer 1020 in terms of thickness or composition. In one implementation, the first 2D material layer 1010 and the second 2D material layer 1020 have the same composition but different thicknesses for different electronic confinement. In another implementation, the first 2D material layer 1010 and the second 2D material layer 1020 have the same thickness but different compositions for different band alignment with the material of the fin structure 103. Here, different compositions may refer to different 2D materials or different doping arrangements. For example, the first 2D material layer 1010 and the second 2D material layer 1020 may be said to have different compositions if the first 2D material layer 1010 is formed of tungsten sulfide ($WS_2$) and the second 2D material layer 1020 is formed of tungsten selenide ($WSe_2$). For another example, the first 2D material layer 1010 and the second 2D material layer 1020 may be said to have different compositions if the first 2D material layer 1010 and the second 2D material layer 1020 are doped with different dopants or the same dopants with different doping concentrations. The deposition of the first 2D material layer 1010 and the second 2D material layer 1020 in different device regions may be performed using masks or selective deposition.

Implementing different 2D material layers in different device regions may have advantages. For example, the first 2D material layer 1010 and the second 2D material layer 1020 may be selected to balance the drive currents of the first transistor 100-1 in the first device region R1 and the second transistor 100-2 in the second device region. When a second drive current of a none-dual-channel FinFET in the second device region R2 is smaller than a first drive current of a none-dual-channel FinFET in the first device region R1, the second 2D material layer 1020 may boost the second drive current more than the first 2D material layer 1010 boosts the first drive current. The ability to balance drive currents by implementing different 2D material layers may also ease the need to stack various work function layers in the gate structure 110. By having different 2D material layers, the gate structure 110 may have fewer work function layers or may even be free of any work function layers. In alternative embodiments, the first device region R1 is a p-type device region and the second device region R2 is an n-type device region.

Figure 18:
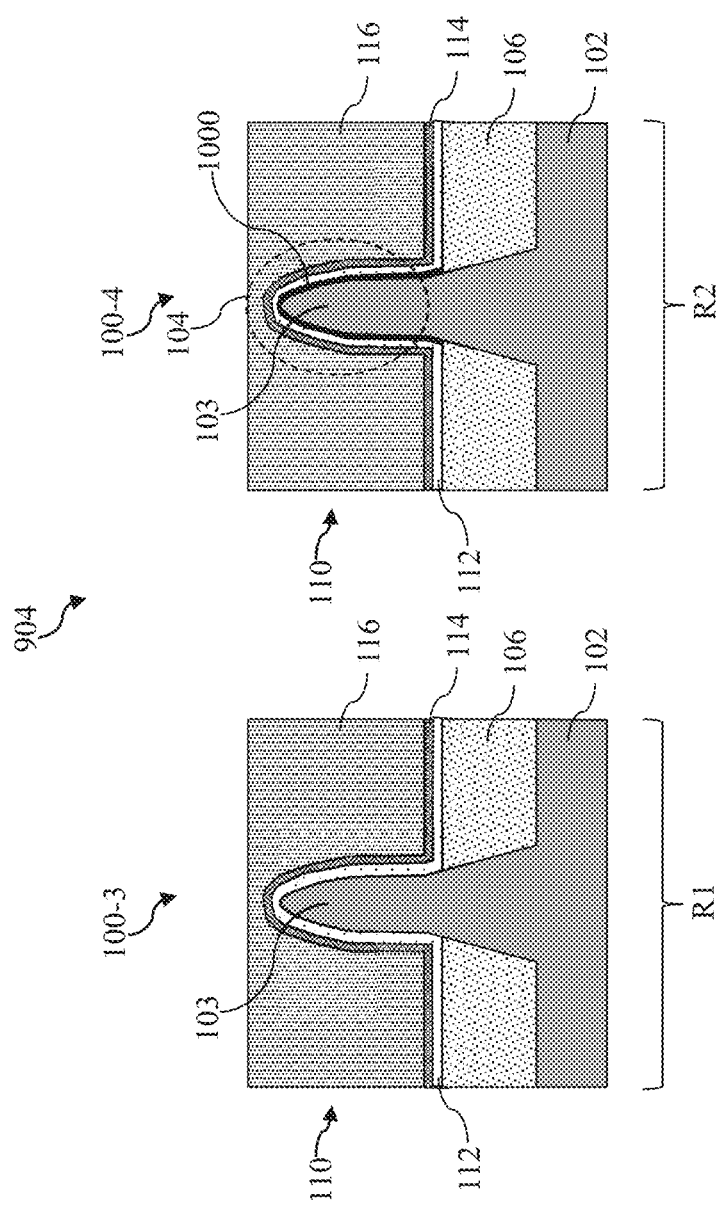

Referring to FIG. 18, which schematically illustrates a second IC device 904 that has a first device region R1 and a second device region R2. In some embodiments, the first device region R1 is an n-type device region and the second device region R2 is a p-type device region. The first device region R1 includes a third transistor 100-3 and the second device region R2 includes a fourth transistor 100-4. In some embodiments represented in FIG. 18, the third transistor 100-3 may be a FinFET free of any 2D material layers and the fourth transistor 100-4 may be a dual-channel FinFET having a structure similar to those illustrated in FIGS. 3D, 5D, 7F, and 9E. In these embodiments, the 2D material layer 1000 may boost the drive current of the fourth transistor 100-4 to balance the drive currents of the third transistor 100-3 and the fourth transistor 100-4. In alternative embodiments, the first device region R1 is a p-type device region and the second device region R2 is an n-type device region. The deposition of the 2D material layer 1000 in one of the device regions may be performed using masks or selective deposition.

Figure 19:
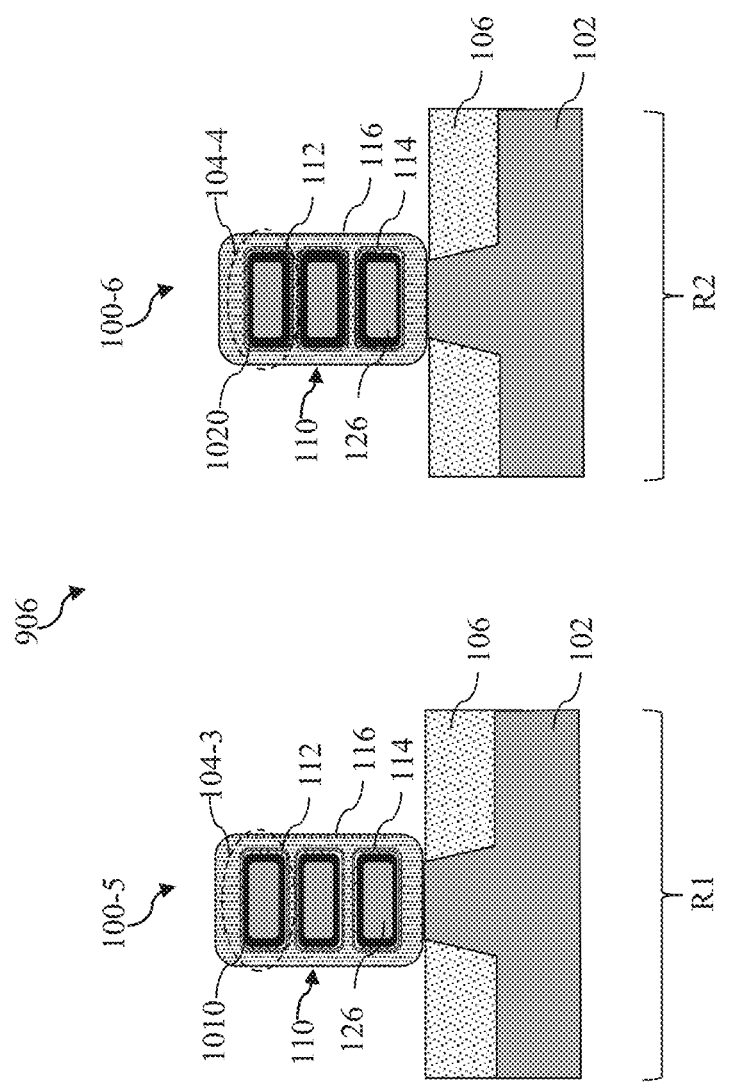

Similar DCFET implementations may be applicable to MBC transistors. Referring now to FIG. 19, which schematically illustrates a third IC device 906 that has a first device region R1 and a second device region R2. In some embodiments, the first device region R1 is an n-type device region and the second device region R2 is a p-type device region. The first device region R1 of the third IC device 906 includes a fifth transistor 100-5 and the second device region R2 of the third IC device 906 includes a sixth transistor 100-6. Each of the fifth transistor 100-5 and the sixth transistor 100-6 may be a dual-channel MBC transistor having a structure similar to those illustrated in FIGS. 11F, 13F, 15F, or 16F and detailed descriptions of various features of them are omitted for brevity. In the example illustrated in FIG. 19, the fifth transistor 100-5 includes a first 2D material layer 1010 disposed around each of the vertically stacked channel members 104 and the sixth transistor 100-6 includes a second 2D material layer 1020 disposed around each of the vertically stacked channel members 104. The first 2D material layer 1010 is different from the second 2D material layer 1020 in terms of thickness or composition. In one implementation, the first 2D material layer 1010 and the second 2D material layer 1020 have the same composition but different thicknesses for different electronic confinement. In another implementation, the first 2D material layer 1010 and the second 2D material layer 1020 have the same thickness but different compositions for different band alignment with the material of the channel layers 126. Here, different compositions may refer to different 2D materials or different doping arrangements. For example, the first 2D material layer 1010 and the second 2D material layer 1020 may be said to have different compositions if the first 2D material layer 1010 is formed of tungsten sulfide ($WS_2$) and the second 2D material layer 1020 is formed of tungsten selenide ($WSe_2$). For another example, the first 2D material layer 1010 and the second 2D material layer 1020 may be said to have different compositions if the first 2D material layer 1010 and the second 2D material layer 1020 are doped with different dopants or the same dopants with different doping concentrations. The deposition of the first 2D material layer 1010 and the second 2D material layer 1020 in different device regions may be performed using masks or selective deposition.

Implementing different 2D material layers in different device regions may have advantages. For example, the first 2D material layer 1010 and the second 2D material layer 1020 may be selected to balance the drive currents of the fifth transistor 100-5 in the first device region R1 and the sixth transistor 100-6 in the second device region. When a second drive current of a none-dual-channel MBC transistor in the second device region R2 is smaller than a first drive current of a none-dual-channel FinFET in the first device region R1, the second 2D material layer 1020 may boost the second drive current more than the first 2D material layer 1010 boosts the first drive current. The ability to balance drive currents by implementing different 2D material layers may also ease the need to stack various work function layers in the gate structure 110. By having different 2D material layers, the gate structure 110 may have fewer work function layers or may even be free of any work function layers. This is particularly beneficial when it is challenging to uniformly deposit multiple layers around each of the vertically stacked channel members of an MBC transistor. In alternative embodiments, the first device region R1 is a p-type device region and the second device region R2 is an n-type device region.

Figure 20:
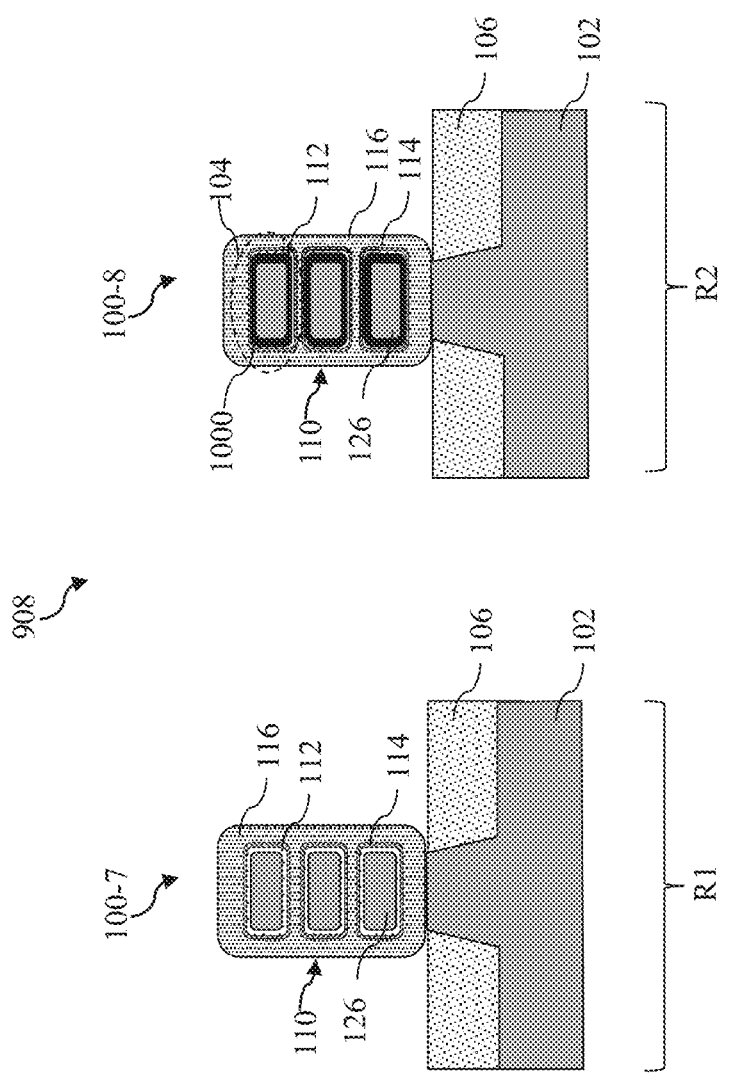

Referring to FIG. 20, which schematically illustrates a fourth IC device 908 that has a first device region R1 and a second device region R2. In some embodiments, the first device region R1 of the fourth IC device 908 is an n-type device region and the second device region R2 of the fourth IC device 908 is a p-type device region. The first device region R1 includes a seventh transistor 100-7 and the second device region R2 includes an eighth transistor 100-8. In some embodiments represented in FIG. 20, the seventh transistor 100-7 may be an MBC transistor free of any 2D material layers and the eighth transistor 100-8 may be a dual-channel MBC transistor having a structure similar to those illustrated in FIGS. 11F, 13F, 15F, and 16F. In these embodiments, the 2D material layer 1000 may boost the drive current of the eighth transistor 100-8 to balance the drive currents of the seventh transistor 100-7 and the eighth transistor 100-8. In alternative embodiments, the first device region R1 is a p-type device region and the second device region R2 is an n-type device region. The deposition of the 2D material layer 1000 in one of the device regions may be performed using masks or selective deposition.

In one exemplary aspect, the present disclosure is directed to a semiconductor device. The semiconductor device includes a channel member having a first channel layer and a second channel layer over the first channel layer, and a gate structure over the channel member. The first channel layer includes silicon, germanium, a III-V semiconductor, or a II-VI semiconductor and the second channel layer includes a two-dimensional material.

In some embodiments, the two-dimensional material includes graphene, tungsten sulfide ($WS_2$), tungsten telluride ($WTe_2$), tungsten selenide ($WSe_2$), molybdenum sulfide ($MoS_2$), molybdenum telluride ($WTe_2$), black phosphorus, or molybdenum selenide ($WSe_2$). In some embodiments, the semiconductor device may further include a substrate and wherein the first channel layer includes a fin structure extending from the substrate and the second channel layer is disposed over the fin structure. In some implementations, the semiconductor device may further include an isolation feature disposed over the substrate and sidewalls of the fin structure. The isolation feature is spaced apart from the first channel layer by the second channel layer. In some embodiments, the semiconductor device may further include an isolation feature disposed over the substrate and sidewalls of the fin structure and the isolation feature is in direct contact with the first channel layer. In some implementations, the second channel layer wraps around the first channel layer. In some instances, the channel member further includes a third channel layer disposed below the first channel layer such that the second channel layer is sandwiched between the first channel layer and the third channel layer. The third channel layer includes the two-dimensional material. In some embodiments, the two-dimensional material is a first two-dimensional material and the second channel layer further includes a second two-dimensional material. The first two-dimensional material and the second two-dimensional material are selected from a group consisting of graphene, tungsten sulfide ($WS_2$), tungsten telluride ($WTe_2$), tungsten selenide ($WSe_2$), molybdenum sulfide ($MoS_2$), molybdenum telluride ($WTe_2$), black phosphorus, and molybdenum selenide ($WSe_2$) and a composition of the first two-dimensional material is different from a composition of the second two-dimensional material.

In another exemplary aspect, the present disclosure is directed to a semiconductor device. The semiconductor device includes a first transistor in a first device region and a second transistor in a second device region. The first transistor includes a first channel member including a first channel layer and a second channel layer over the first channel layer and a first gate structure over the first channel member. The second transistor includes a second channel member including a third channel layer and a second gate structure over the second channel member. The first channel layer and the third channel layer include silicon, germanium, a III-V semiconductor, or a II-VI semiconductor. The second channel layer includes a first two-dimensional material.

In some embodiments, the first two-dimensional material includes graphene, tungsten sulfide ($WS_2$), tungsten telluride ($WTe_2$), tungsten selenide ($WSe_2$), molybdenum sulfide ($MoS_2$), molybdenum telluride ($WTe_2$), black phosphorus, or molybdenum selenide ($WSe_2$). In some implementations, the second channel layer wraps around the first channel layer, the first gate structure wraps around the first channel member, and the second gate structure wraps around the second channel member. In some instances, the second channel member further includes a fourth channel layer disposed over the third channel layer and the third channel layer includes a second two-dimensional material different from the first two-dimensional material. In some embodiment, the semiconductor device may further include a substrate. The first channel layer includes a first fin structure extending from the substrate and the second channel layer is disposed over the first fin structure. The third channel layer includes a second fin structure extending from the substrate. In some implementations, the second channel member is free of the first two-dimensional material.

In yet another exemplary aspect, the present disclosure is directed to a method. The method includes providing a workpiece including a semiconductor structure, wherein the semiconductor structure includes silicon, germanium, a III-V semiconductor, or a II-VI semiconductor, depositing a two-dimensional material layer over the semiconductor structure, wherein the two-dimensional material layer includes graphene, tungsten sulfide ($WS_2$), tungsten telluride ($WTe_2$), tungsten selenide ($WSe_2$), molybdenum sulfide ($MoS_2$), molybdenum telluride ($WTe_2$), black phosphorus, or molybdenum selenide ($WSe_2$), and forming a gate structure over the two-dimensional material layer.

In some embodiments, the workpiece further includes a substrate, a first source/drain feature and a second source/drain feature disposed on the substrate. The gate structure is disposed between the first source/drain feature and a second source/drain feature and the semiconductor structure extends between the first source/drain feature and the second source/drain feature and is spaced apart from the substrate. In some implementations, the workpiece further includes a substrate and the semiconductor structure includes a fin structure extending from the substrate. In some instances, the method may further include before the depositing of the two-dimensional material layer, forming an isolation feature. The depositing of the two-dimensional material layer is selective to the semiconductor structure. In some implementations, the method may further include after the depositing of the two-dimensional material layer, forming an isolation feature, and wherein the isolation feature is spaced apart from the semiconductor structure by the two-dimensional material layer. In some embodiments, the method may further include before the depositing of the two-dimensional material layer, forming an isolation feature. The depositing of the two-dimensional material layer includes blanketly depositing the two-dimensional material layer over the semiconductor structure and the isolation feature, and removing the two-dimensional material layer from top surfaces of the isolation feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a substrate;
 a channel member disposed over and spaced apart from the substrate, the channel member including a first channel layer and a second channel layer over the first channel layer; and
 a gate structure wrapping completely around the channel member such that the gate structure engages a bottom surface of the channel member,
 wherein the first channel layer comprises silicon, germanium, a III-V semiconductor, or a II-VI semiconductor,
 wherein the second channel layer comprises a two-dimensional material,
 wherein the two-dimensional material comprises graphene, tungsten sulfide ($WS_2$), tungsten telluride ($WTe_2$), tungsten selenide ($WSe_2$), molybdenum sulfide ($MoS_2$), molybdenum telluride ($MoS_2$), black phosphorus, or molybdenum selenide ($WSe_2$).

2. The semiconductor device of claim 1, wherein the second channel layer wraps completely around the first channel layer such that the second channel layer is in direct contact with a bottom surface of the first channel layer.

3. The semiconductor device of claim 1,
 wherein the channel member further comprises a third channel layer disposed below the first channel layer such that the second channel layer is sandwiched between the first channel layer and the third channel layer,
 wherein the third channel layer comprises the two-dimensional material.

4. The semiconductor device of claim 1,
 wherein the two-dimensional material is a first two-dimensional material,
 wherein the second channel layer further comprises a second two-dimensional material,
 wherein the first two-dimensional material and the second two-dimensional material are selected from a group consisting of graphene, tungsten sulfide ($WS_2$), tungsten telluride ($WTe_2$), tungsten selenide ($WSe_2$), molybdenum sulfide ($MoS_2$), molybdenum telluride ($MoS_2$), black phosphorus, and molybdenum selenide ($WSe_2$),
 wherein a composition of the first two-dimensional material is different from a composition of the second two-dimensional material.

5. The semiconductor device of claim 1, wherein the gate structure is in direct physical contact with the first channel layer and the second channel layer.

6. The semiconductor device of claim 1, further comprising:
 a first source/drain feature and a second source/drain feature disposed over the substrate, wherein the channel member extends between the first source/drain feature and the second source/drain feature.

7. The semiconductor device of claim 1,
 wherein the channel member comprises a width W and a height H,
 wherein a ratio of the width W to the height H is greater than 1.5 such that channel member resembles a sheet.

8. The semiconductor device of claim 1, further comprising:
 an isolation feature disposed on the substrate;
 a base portion extending from the substrate and through the isolation feature; and
 a semiconductor layer disposed on a top surface of the base portion,
 wherein the semiconductor layer comprises graphene, tungsten sulfide ($WS_2$), tungsten telluride ($WTe_2$), tungsten selenide ($WSe_2$), molybdenum sulfide ($MoS_2$), molybdenum telluride ($MoS_2$), black phosphorus, or molybdenum selenide ($WSe_2$).

9. A semiconductor device, comprising:
a first transistor in a first device region, the first transistor comprising:
a first channel member including a first channel layer and a second channel layer over the first channel layer, and
a first gate structure over the first channel member; and
a second transistor in a second device region, the second transistor comprising:
a second channel member including a third channel layer, and
a second gate structure disposed over and in direct contact with the third channel layer,
wherein the first channel layer and the third channel layer comprise silicon, germanium, a III-V semiconductor, or a II-VI semiconductor,
wherein the second channel layer comprises a first two-dimensional material,
wherein the first two-dimensional material comprises graphene, tungsten sulfide ($WS_2$), tungsten telluride ($WTe_2$), tungsten selenide ($WSe_2$), molybdenum sulfide ($MoS_2$), molybdenum telluride ($MoS_2$), black phosphorus, or molybdenum selenide ($WSe_2$).

10. The semiconductor device of claim 9,
wherein the second channel layer wraps around the first channel layer,
wherein the first gate structure wraps around the first channel member, and
wherein the second gate structure wraps around the second channel member.

11. The semiconductor device of claim 9,
wherein the second channel member further comprises a fourth channel layer disposed over the third channel layer,
wherein the third channel layer comprises a second two-dimensional material different from the first two-dimensional material.

12. The semiconductor device of claim 9, further comprising:
a substrate,
wherein the first channel layer comprises a first fin structure extending from the substrate and the second channel layer is disposed over the first fin structure, and
wherein the third channel layer comprises a second fin structure extending from the substrate.

13. The semiconductor device of claim 9, where the second channel member is free of the first two-dimensional material.

14. The semiconductor device of claim 9, wherein the first gate structure is in direct physical contact with the first channel layer.

15. A method, comprising:
providing a workpiece comprising a substrate and a semiconductor structure extending from the substrate, wherein the semiconductor structure comprises silicon, germanium, a III-V semiconductor, or a II-VI semiconductor;
forming an isolation structure over the substrate and sidewalls of the semiconductor structure;
selectively depositing a two-dimensional material layer over surfaces of the semiconductor structure while a top surface of the isolation structure is substantially free of the two-dimensional material layer, wherein the two-dimensional material layer comprises graphene, tungsten sulfide ($WS_2$), tungsten telluride ($WTe_2$), tungsten selenide ($WSe_2$), molybdenum sulfide ($MoS_2$), molybdenum telluride ($MoS_2$), black phosphorus, or molybdenum selenide ($WSe_2$); and
forming a gate structure over the two-dimensional material layer and the isolation structure.

16. The method of claim 15,
wherein the workpiece further comprises a first source/drain feature and a second source/drain feature disposed on the substrate,
wherein the gate structure is disposed between the first source/drain feature and a second source/drain feature,
wherein the semiconductor structure extends between the first source/drain feature and the second source/drain feature.

17. The method of claim 15,
wherein the semiconductor structure comprises a fin structure.

18. The method of claim 15, wherein the selectively depositing comprises:
before the depositing of the two-dimensional material layer, selectively depositing a blocking layer on top surface of the isolation structure while surfaces of the semiconductor structure are substantially free of the blocking layer.

19. The method of claim 18, wherein the blocking layer comprises N-Trimethylsilylpyrrole, octadecyltrichlorosilane, or trimethylchlorosilane.

20. The method of claim 15, wherein the selectively depositing of the two-dimensional material layer comprises:
blanketly depositing the two-dimensional material layer over the semiconductor structure and the isolation structure, and
removing the two-dimensional material layer from top surfaces of the isolation structure.

* * * * *